(12) United States Patent
Yamada et al.

(10) Patent No.: US 9,255,802 B2
(45) Date of Patent: Feb. 9, 2016

(54) RESONATOR ELEMENT, RESONATOR, OSCILLATOR, ELECTRONIC APPARATUS, PHYSICAL QUANTITY SENSOR, MOBILE OBJECT, AND FREQUENCY ADJUSTMENT METHOD OF RESONATOR ELEMENT

(71) Applicant: SEIKO EPSON CORPORATION, Tokyo (JP)

(72) Inventors: Akinori Yamada, Ina (JP); Shuhei Yoshida, Minowa-machi (JP); Takashi Ito, Suwa (JP); Keiji Nakagawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/582,606

(22) Filed: Dec. 24, 2014

(65) Prior Publication Data

US 2015/0188515 A1 Jul. 2, 2015

(30) Foreign Application Priority Data

Dec. 27, 2013 (JP) ................................. 2013-273626

(51) Int. Cl.
*H03B 5/32* (2006.01)
*H03H 9/215* (2006.01)
*G01C 19/5607* (2012.01)
(Continued)

(52) U.S. Cl.
CPC .............. *G01C 19/5607* (2013.01); *H03B 5/32* (2013.01); *H03H 9/02102* (2013.01); *H03H 9/02551* (2013.01); *H03H 9/0509* (2013.01); *H03H 9/0547* (2013.01); *H03H 9/1014* (2013.01); *H03H 9/215* (2013.01); *H03H 2003/026* (2013.01); *H03H 2003/0492* (2013.01); *H03H 2009/02165* (2013.01)

(58) Field of Classification Search
CPC .............. H03B 5/30; H03B 5/32; H03H 9/17; H03H 9/19; H03H 9/21; H03H 9/215; H03H 9/2468; H03H 2003/026; H03H 2003/0421; H03H 2003/0492
USPC .......... 310/311, 312, 348, 370; 331/154, 156, 331/158
See application file for complete search history.

(56) References Cited

U.S. PATENT DOCUMENTS 4,080,696 A * 3/1978 Shimatsu ..................... 29/25.35
6,545,392 B2 4/2003 Kawauchi et al.
(Continued)

FOREIGN PATENT DOCUMENTS

JP H03-243010 A 10/1991
JP 2756559 B2 5/1998
(Continued)

*Primary Examiner* — Levi Gannon
(74) *Attorney, Agent, or Firm* — Oliff PLC

(57) ABSTRACT

A resonator element includes a base portion, and a vibrating arm which extends from the base portion and on which a weight portion is provided, and the weight portion includes a first weight portion which is disposed on one main surface of a distal end portion of the vibrating arm, and a second weight portion which is disposed on the distal end side with respect to the first weight portion and has a thickness smaller than that of the first weight portion. The vibrating arm transmits an energy beam, and a laser incidence area where incidence of the energy beam to the inside of the vibrating arm is allowed, is disposed in a position of the other main surface on the opposite side of the vibrating arm overlapped with the second weight portion.

19 Claims, 23 Drawing Sheets

(51) Int. Cl.
*H03H 9/02* (2006.01)
*H03H 9/05* (2006.01)
*H03H 9/10* (2006.01)
H03H 3/02 (2006.01)
H03H 3/04 (2006.01)

(56) References Cited

U.S. PATENT DOCUMENTS

| | | | |
|---|---|---|---|
| 6,924,582 B2* | 8/2005 | Shimizu et al. | 310/312 |
| 7,511,405 B2* | 3/2009 | Numata et al. | 310/344 |
| 8,063,542 B2* | 11/2011 | Ono et al. | 310/348 |
| 8,604,677 B2 | 12/2013 | Kawase et al. | |
| 2003/0234835 A1* | 12/2003 | Torii et al. | 347/68 |
| 2008/0106172 A1* | 5/2008 | Tanaya et al. | 310/344 |
| 2008/0315727 A1* | 12/2008 | Ishikawa et al. | 310/370 |
| 2009/0160295 A1* | 6/2009 | Iwatate et al. | 310/370 |
| 2012/0248938 A1* | 10/2012 | Kawanishi | 310/344 |
| 2013/0020915 A1* | 1/2013 | Sakamoto | 310/370 |

FOREIGN PATENT DOCUMENTS

| | | |
|---|---|---|
| JP | A 2003-133879 | 5/2003 |
| JP | 2006-229877 A | 8/2006 |
| JP | A 2008-54273 | 3/2008 |
| JP | A 2010-283526 | 12/2010 |
| JP | A 2011-151567 | 8/2011 |
| JP | B2 4936152 | 5/2012 |
| JP | A 2012-120075 | 6/2012 |
| JP | 5031526 B2 | 9/2012 |
| JP | A 2012-186679 | 9/2012 |
| JP | B2 5123987 | 1/2013 |
| JP | A 2013-197856 | 9/2013 |
| JP | A 2014-22862 | 2/2014 |

* cited by examiner

RESONATOR ELEMENT, RESONATOR, OSCILLATOR, ELECTRONIC APPARATUS, PHYSICAL QUANTITY SENSOR, MOBILE OBJECT, AND FREQUENCY ADJUSTMENT METHOD OF RESONATOR ELEMENT

BACKGROUND

1. Technical Field

The present invention relates to a resonator element, a resonator, an oscillator, an electronic apparatus, a physical quantity sensor, a mobile object, and a frequency adjustment method of a resonator element.

2. Related Art

In the related art, a resonator element using quartz crystal has been known. Such a resonator element has an excellent frequency temperature behavior, and thus, it is broadly used as a reference frequency source or a transmission source of various electronic apparatuses. For example, a method disclosed in JP-A-2003-133879 has been known, as a method of adjusting a frequency of the resonator element.

The frequency adjustment method disclosed in JP-A-2003-133879 is a method of performing the frequency adjustment in a state where the resonator element is accommodated in a package. More specifically, a weight portion (metal film) is provided on both surfaces of a distal end portion of a vibrating arm included in the resonator element. A cover of the package is set so that laser light can penetrate therethrough. The frequency adjustment method is a method of performing the frequency adjustment of the resonator element with the incidence of the laser light to the weight portion through the cover, and removing at least a part of the weight portion provided on both surfaces of the vibrating arm to decrease mass of the vibrating arm. However, such a frequency adjustment method has the following problems.

In the frequency adjustment method disclosed in JP-A-2003-133879, the weight portion (hereinafter, referred to as a "cover side weight portion" for convenience) is provided on the main surface of the vibrating arm on the cover side. Accordingly, the cover side weight portion evaporated by the laser emission is scattered to be attached to the inner surface of the cover. The weight material attached to the inner surface of the cover is evaporated again by the heat of the laser emitted with the deviated emission position through the cover, and the evaporated weight material is scattered to be attached to the cover side weight portion again. As described above, in the frequency adjustment method disclosed in JP-A-2003-133879, reattachment of a part of the removed weight may occur, an adjustable frequency range may be narrowed, and thus, low efficiency and low accuracy of the frequency adjustment are obtained.

SUMMARY

An advantage of some aspects of the invention is to provide a resonator element which can perform frequency adjustment with excellent efficiency and accuracy, a resonator, an oscillator, an electronic apparatus, a physical quantity sensor, and a mobile object which include the resonator element and have high reliability, and a frequency adjustment method of a resonator element which can perform frequency adjustment of a resonator element with excellent efficiency and accuracy.

The invention can be implemented as the following application examples.

Application Example 1

This application example is directed to a resonator element including: a base portion; and a vibrating arm which extends from the base portion in a plan view and on which a weight portion is provided, in which the weight portion includes a first weight portion which is disposed on one main surface of a distal end portion of the vibrating arm on the opposite side of the base portion, in a plan view, and a second weight portion which is disposed on the base portion side with respect to the first weight portion and has a thickness smaller than that of the first weight portion, the vibrating arm transmits an energy beam, and an area where incidence of the energy beam to the inside of the vibrating arm is allowed, is disposed in a position of the other main surface, which is in a front-back relationship with the one main surface of the vibrating arm, overlapped with the second weight portion in a plan view.

With this configuration, since the energy beam is emitted from the other main surface side, it is possible to more efficiently suppress reattachment of the evaporated weight portion to the vibrating arm. Therefore, a resonator element which can efficiently and accurately perform frequency adjustment is obtained.

Application Example 2

This application example is directed to the resonator element according to the application example described above, wherein the area is also disposed in a position of the other main surface overlapped with the first weight portion in a plan view.

With this configuration, since the energy beam is emitted from the other main surface side, it is possible to more efficiently suppress the reattachment of the evaporated weight portion to the vibrating arm. Therefore, a resonator element which can efficiently and accurately perform the frequency adjustment is obtained.

Application Example 3

This application example is directed to the resonator element according to the application example described above, wherein when a length of the first weight portion in the extension direction is set as L1 and a length of the second weight portion in the extension direction is set as L2, a relationship of the following formula is satisfied.

$$0.1 \le \frac{L1}{L1+L2} \le 0.8$$

With this configuration, the first weight portion can be used for coarse adjustment of the frequency and the second weight portion can be used for fine adjustment of the frequency. Since a relationship of the length L1 of the first weight portion and the length L2 of the second weight portion is the relationship of the application example, it is possible to sufficiently secure the wide first and second weight portions, and it is possible to simply perform the coarse adjustment and the fine adjustment of the frequency.

Application Example 4

This application example is directed to the resonator element according to the application example described above, wherein a relationship of the following formula is satisfied.

$$0.3 \leq \frac{L1}{L1+L2} \leq 0.6$$

With this configuration, it is possible to sufficiently secure the wide first and second weight portions, and it is possible to simply perform the coarse adjustment and the fine adjustment of the frequency.

Application Example 5

This application example is directed to the resonator element according to the application example described above, wherein the first weight portion is formed by stacking at least a first weight layer and a second weight layer provided on the first weight layer, from the one main surface side, and the second weight portion is configured with the first weight layer.

With this configuration, it is possible to simply form the first and second weight portions.

Application Example 6

This application example is directed to the resonator element according to the application example described above, wherein the first weight layer is formed by a sputtering method, and the second weight layer is formed by a vapor deposition method.

With this configuration, it is possible to simply form the weight portion. Particularly, since the second weight layer is formed by the vapor deposition method, it is possible to reduce outgassing (degassing) generated when removing the weight portion with the energy beam incidence. Therefore, when performing the frequency adjustment in a state where the resonator element is accommodated in the package, it is possible to suppress a decrease in a degree of vacuum in the package.

Application Example 7

This application example is directed to the resonator element according to the application example described above, wherein the weight portion includes a third weight portion which is disposed on the other main surface so as to be overlapped with the first weight portion in a plan view.

With this configuration, it is possible to more efficiently perform the coarse adjustment of the frequency.

Application Example 8

This application example is directed to the resonator element according to the application example described above, wherein a thickness of the third weight portion is greater than a thickness of the second weight portion.

With this configuration, it is possible to more efficiently perform the coarse adjustment of the frequency.

Application Example 9

This application example is directed to the resonator element according to the application example described above, wherein when a length of the first weight portion in the extension direction is set as L1 and a length of the third weight portion in the extension direction is set as L3, a relationship of L3<L1 is satisfied.

With this configuration, it is possible to prevent the third weight portion covering the area.

Application Example 10

This application example is directed to the resonator element according to the application example described above, wherein a material of the other main surface is exposed from the area.

With this configuration, it is possible to more efficiently perform the incidence of the energy beam to the inside of the vibration arm.

Application Example 11

This application example is directed to the resonator element according to the application example described above, wherein the vibrating arm includes a wide width portion, and an arm which is disposed between the base portion and the wide width portion and has a width smaller than that of the wide width portion, and the weight portion is disposed in the wide width portion.

With this configuration, it is possible to realize miniaturization of the resonator element.

Application Example 12

This application example is directed to a resonator including: the resonator element of the application example described above; and a package in which the resonator element is accommodated.

With this configuration, a resonator having high reliability is obtained.

Application Example 13

This application example is directed to an oscillator including: the resonator element of the application example described above; and a circuit.

With this configuration, an oscillator having high reliability is obtained.

Application Example 14

This application example is directed to an electronic apparatus including: the resonator element of the application example described above.

With this configuration, an electronic apparatus having high reliability is obtained.

Application Example 15

This application example is directed to a physical quantity sensor including: the resonator element of the application example described above.

With this configuration, a physical quantity sensor having high reliability is obtained.

Application Example 16

This application example is directed to a mobile object including: the resonator element of the application example described above.

With this configuration, a mobile object having high reliability is obtained.

Application Example 17

This application example is directed to a frequency adjustment method of a resonator element including: accommodating a resonator element in a package; performing first adjustment of a resonance frequency of the resonator element; and performing second adjustment of the resonance frequency of the resonator element, in which resonator element includes a base portion, and a vibrating arm which extends from the base portion in a plan view and on which a weight portion is provided, the weight portion includes a first weight portion which is disposed on one main surface of a distal end portion of the vibrating arm on the opposite side of the base portion, in a plan view, and a second weight portion which is disposed on the base portion side with respect to the first weight portion and has a thickness smaller than that of the first weight portion, the vibrating arm transmits an energy beam, an area where incidence of the energy beam to the inside of the vibrating arm is allowed, is disposed in a position of the other main surface, which is in a front-back relationship with the one main surface of the vibrating arm, overlapped with the second weight portion in a plan view, the package includes a transmission portion which transmits the energy beam, when accommodating the resonator element, the resonator element is accommodated in the package in a state where the other main surface is positioned on the transmission portion side and the transmission portion and the area face each other, when performing the first adjustment of the resonance frequency of the resonator element, the energy beam is introduced into the package through the transmission portion and is transmitted through the vibrating arm from the other main surface to be emitted to the first weight portion, to remove at least a part of the first weight portion, and when performing the second adjustment of the resonance frequency of the resonator element, the energy beam is introduced into the package through the transmission portion and is transmitted through the vibrating arm from the area to be emitted to the second weight portion, to remove at least a part of the second weight portion.

With this configuration, since the weight portion is positioned on the opposite side of the transmission portion, the weight portion evaporated by the energy beam is hardly attached to the transmission portion. Therefore, the problems disclosed in the related art hardly occur, and it is possible to efficiently and accurately perform the frequency adjustment of the resonator element.

Application Example 18

This application example is directed to the frequency adjustment method of a resonator element according to the application example described above, wherein the area is also disposed in a position of the other main surface of the distal end portion of the vibrating arm overlapped with the first weight portion in a plan view, and when performing the first adjustment of the resonance frequency of the resonator element, the energy beam is introduced into the package through the transmission portion and is transmitted through the vibrating arm from the area to be emitted to the first weight portion, to remove at least a part of the first weight portion.

With this configuration, it is possible to more efficiently and accurately perform the frequency adjustment of the resonator element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
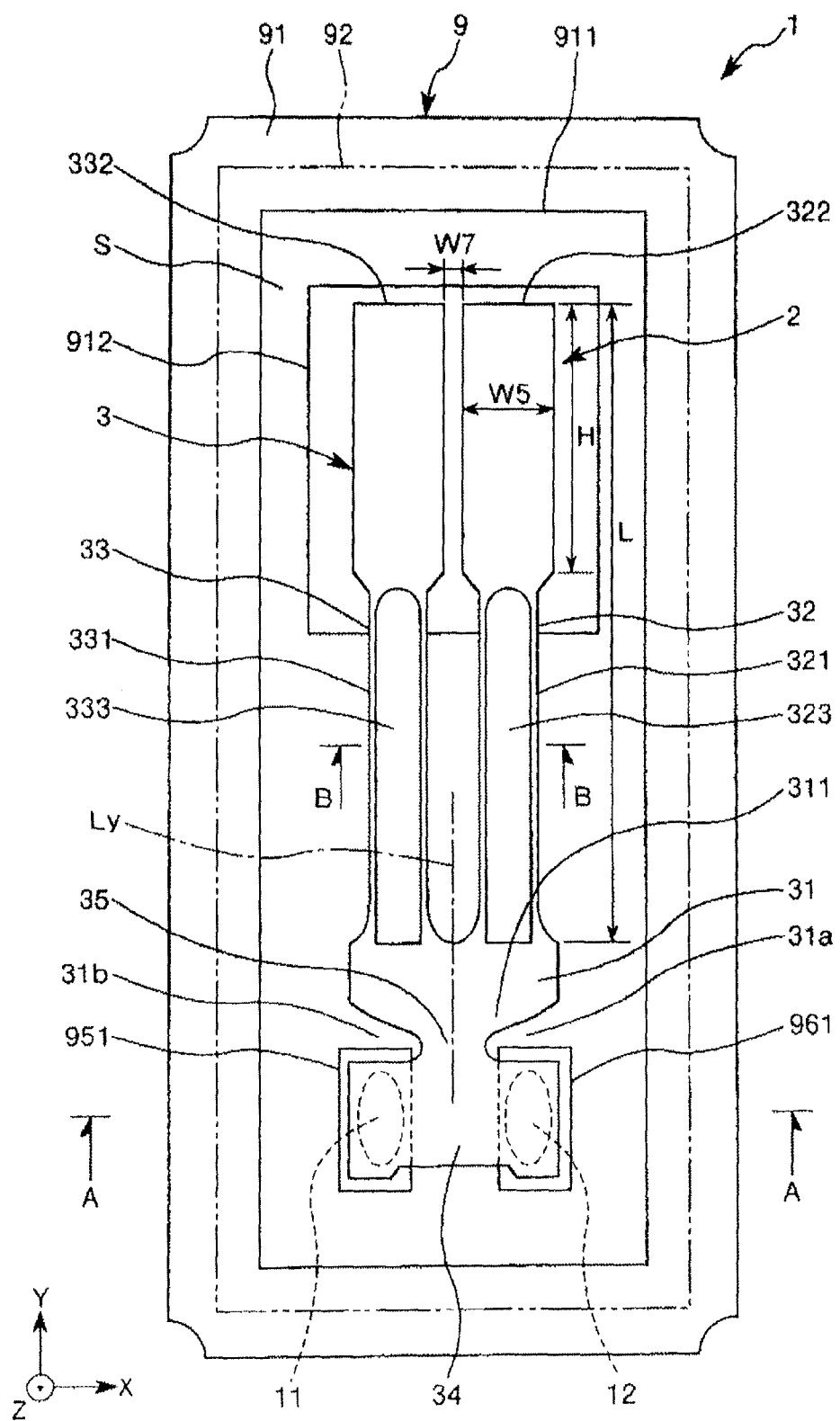
FIG. 1 is a plan view of a resonator according to a first embodiment of the invention.

Hereinafter, a resonator element, a resonator, an oscillator, an electronic apparatus, a physical quantity sensor, and a mobile object according to the invention will be described in detail with reference to preferred embodiments shown in the drawings.

Figure 2:
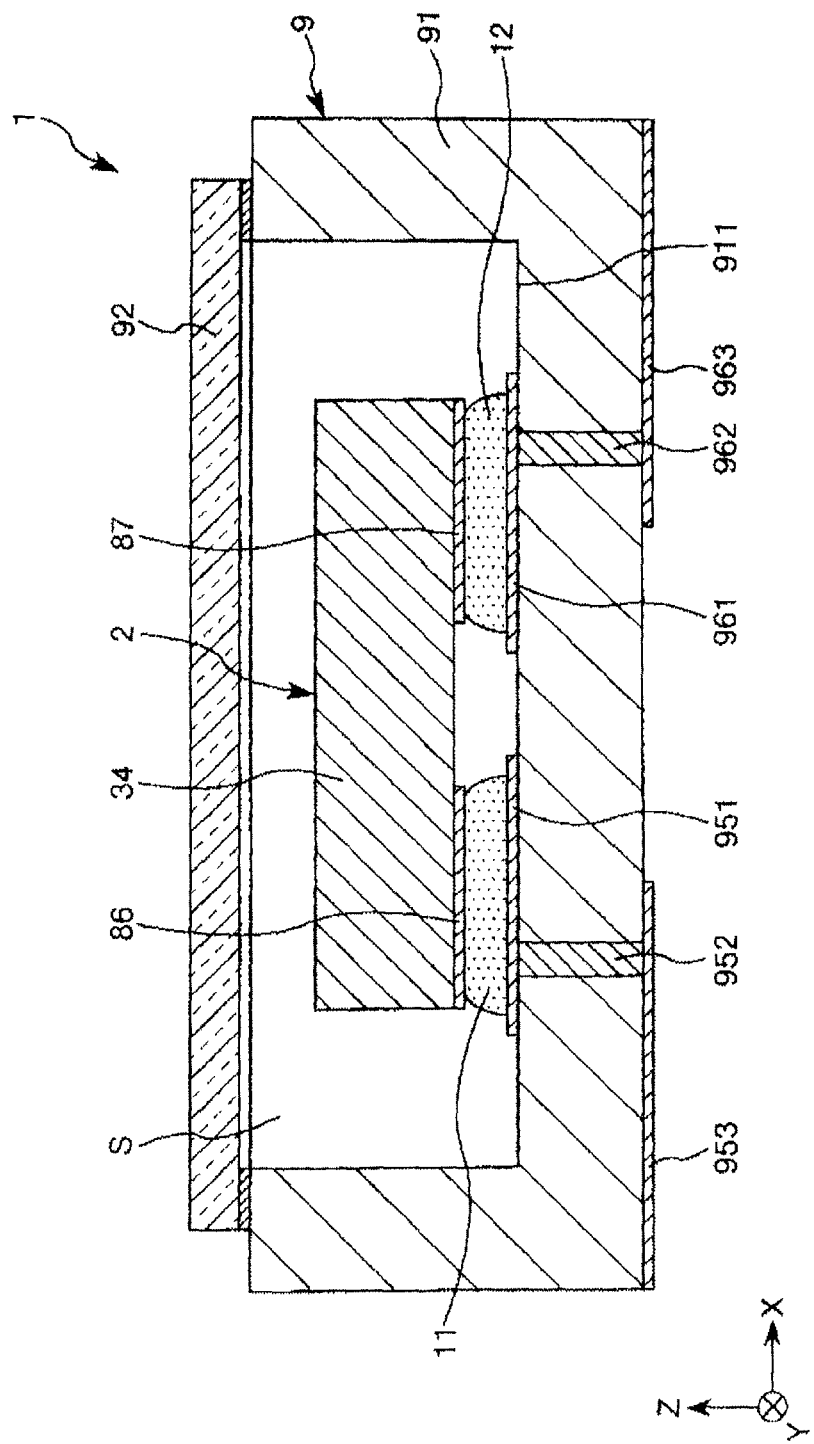
FIG. 2 is a cross-sectional view taken along line A-A of FIG. 1.
Figure 3:
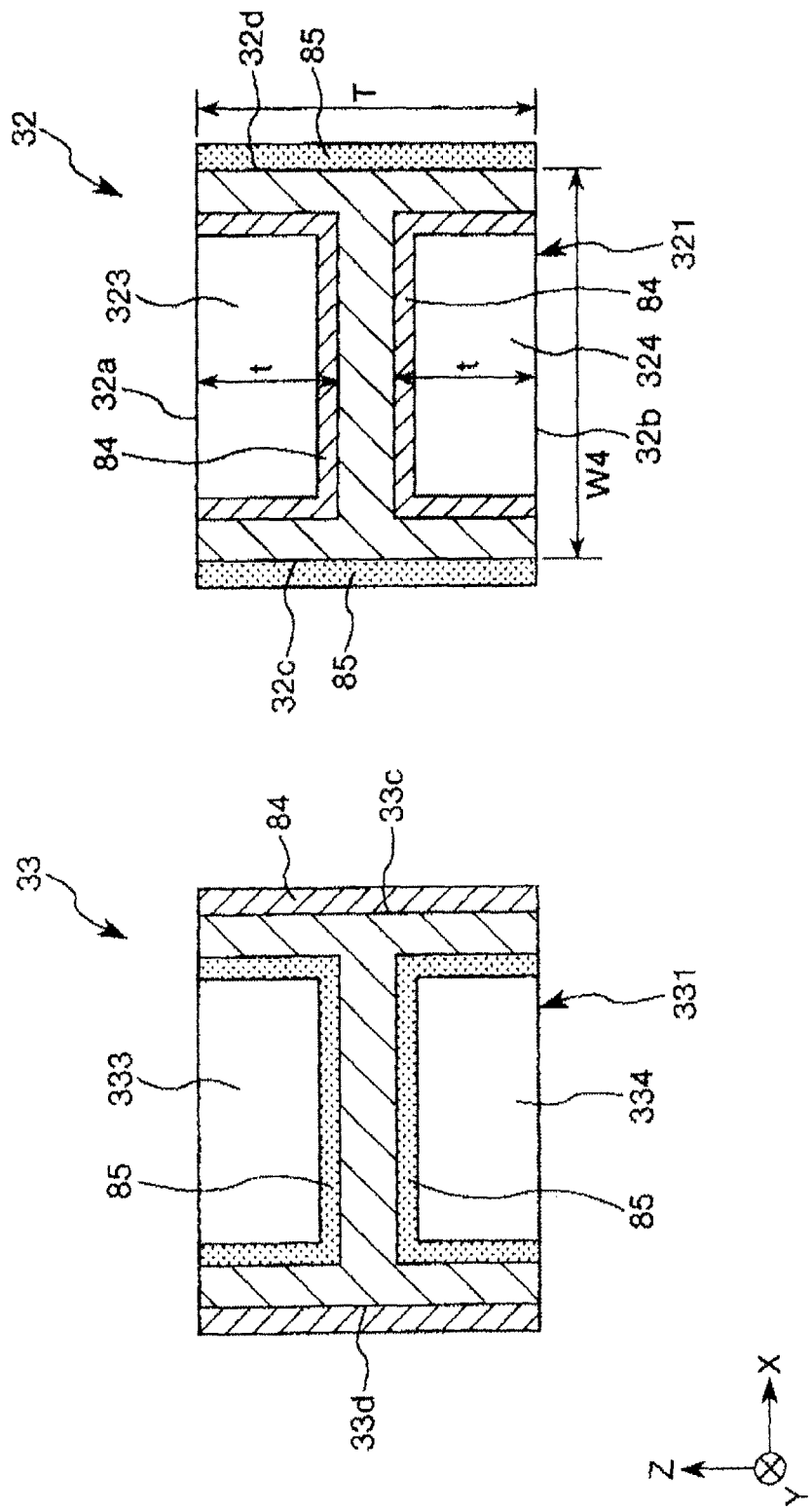
FIG. 3 is a cross-sectional view taken along line B-B of FIG. 1.
Figure 4:
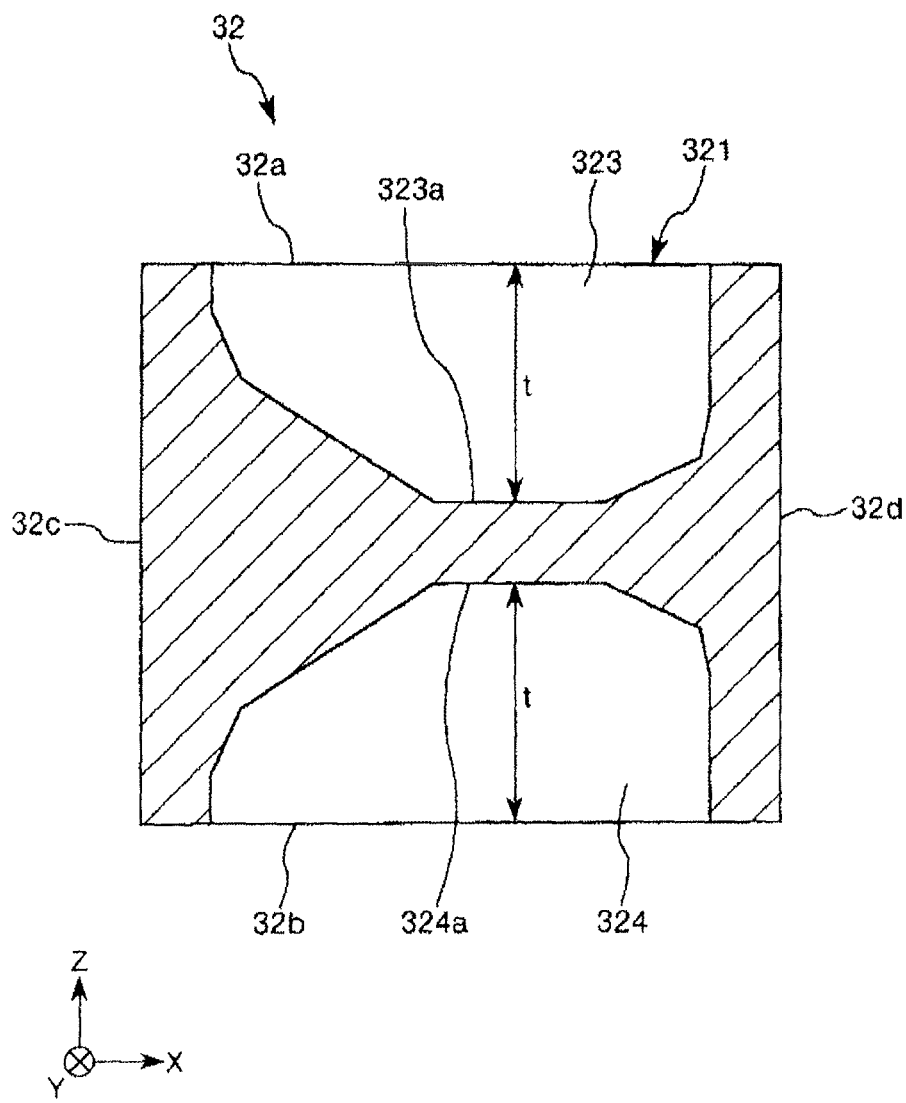
FIG. 4 is a cross-sectional view showing a vibrating arm formed by wet etching.
Figure 5A:
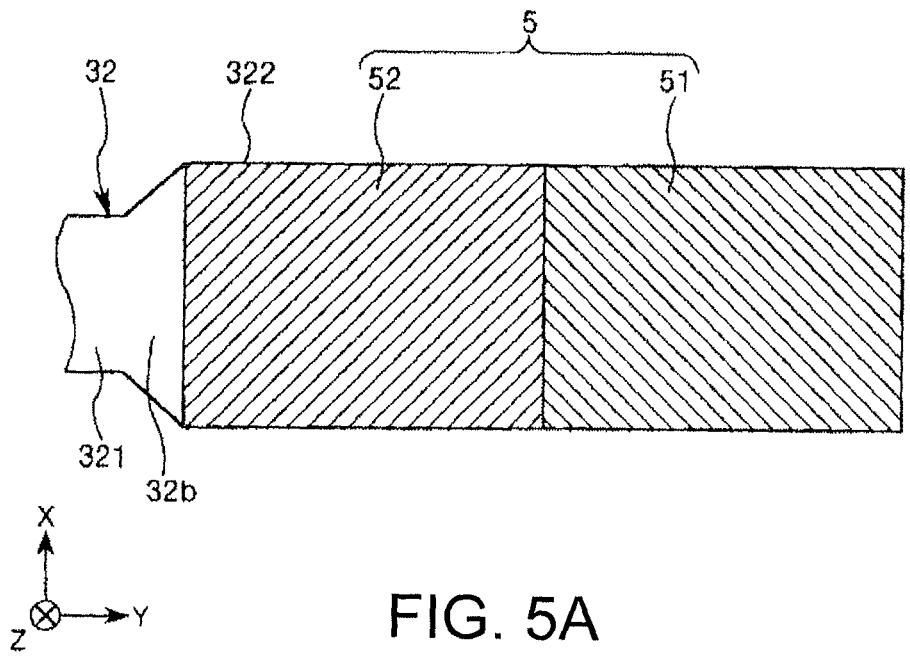
FIGS. 5A and 5B are a plan view and a cross-sectional view showing a weight portion.
Figure 5B:
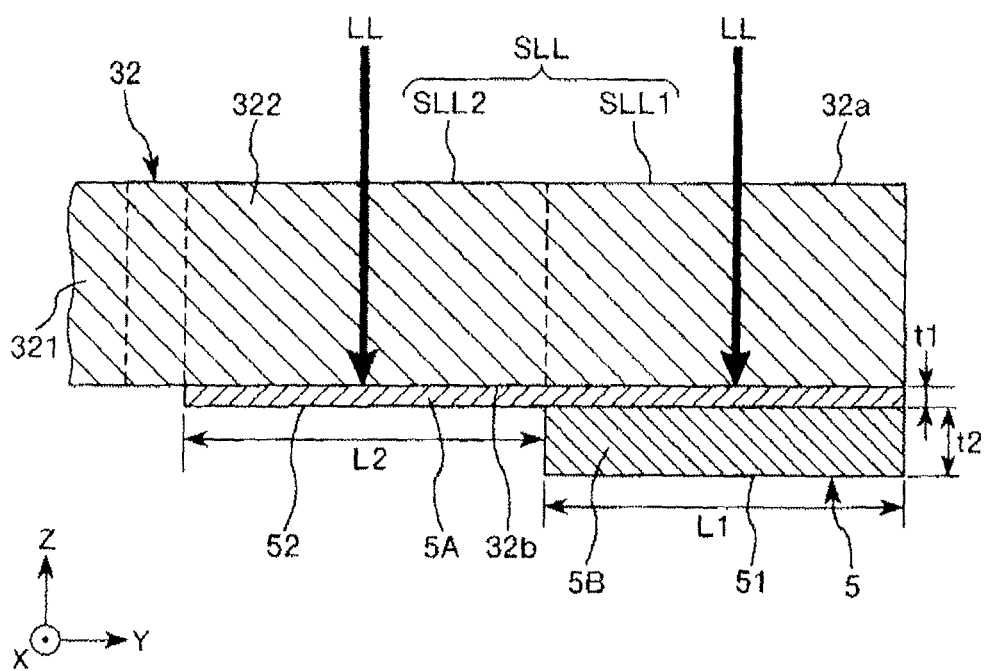
Figure 6A:
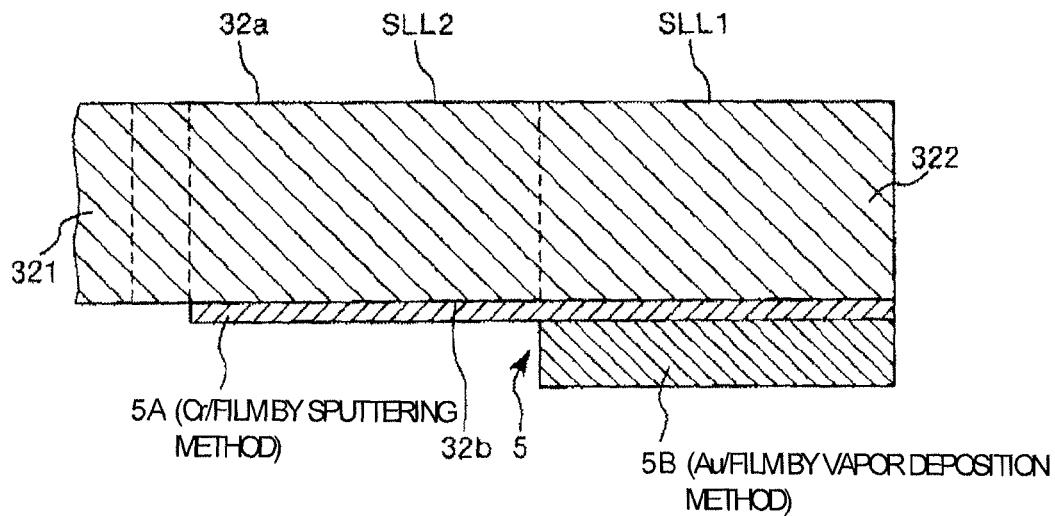
FIGS. 6A and 6B are cross-sectional views showing an example of a specific configuration of a weight portion shown in FIGS. 5A and 5B.
Figure 6B:
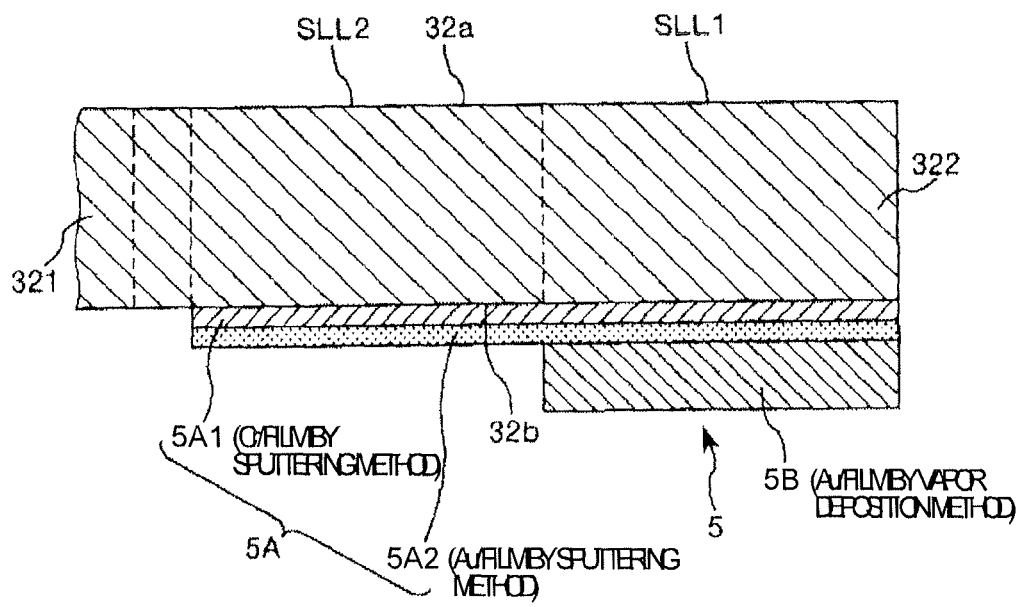
Figure 7:
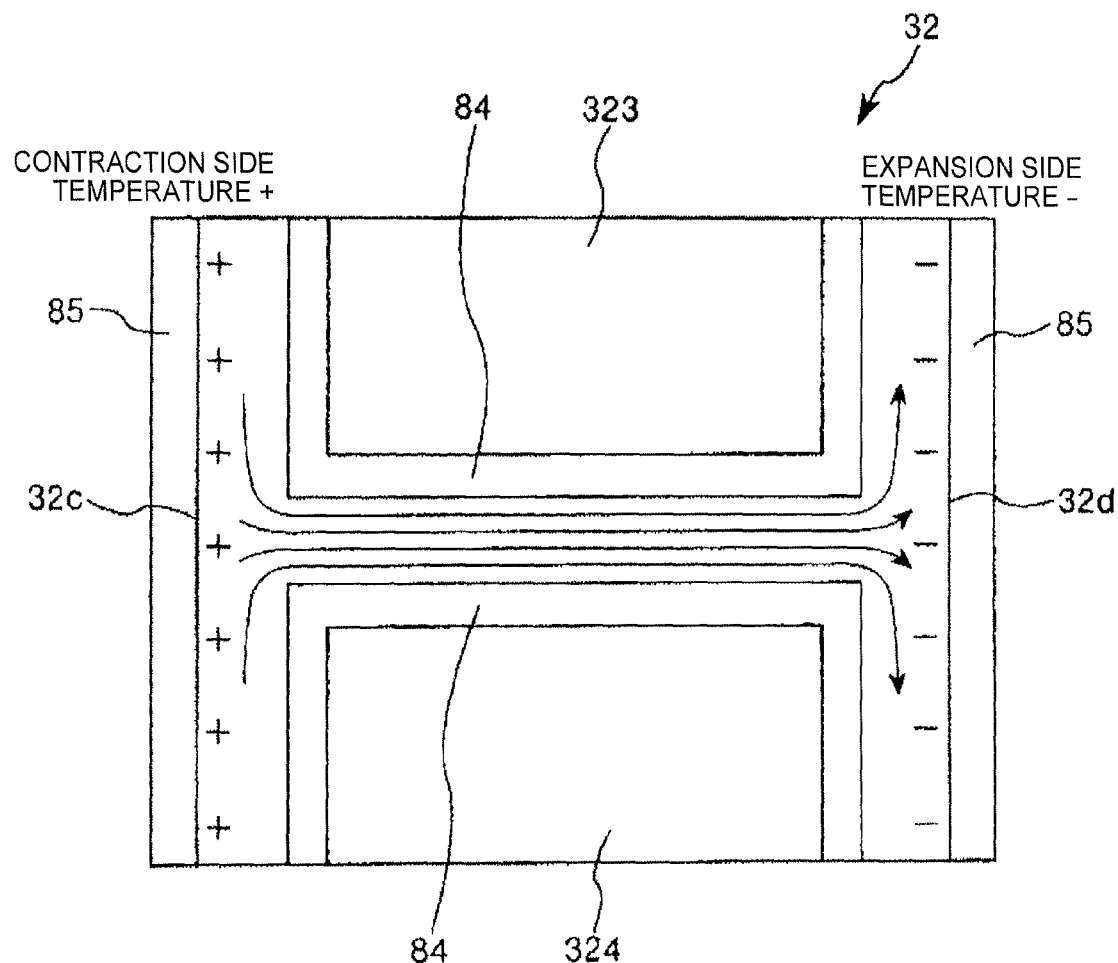
FIG. 7 is a cross-sectional view of a vibrating arm illustrating heat conduction at the time of flexural vibration.
Figure 8:
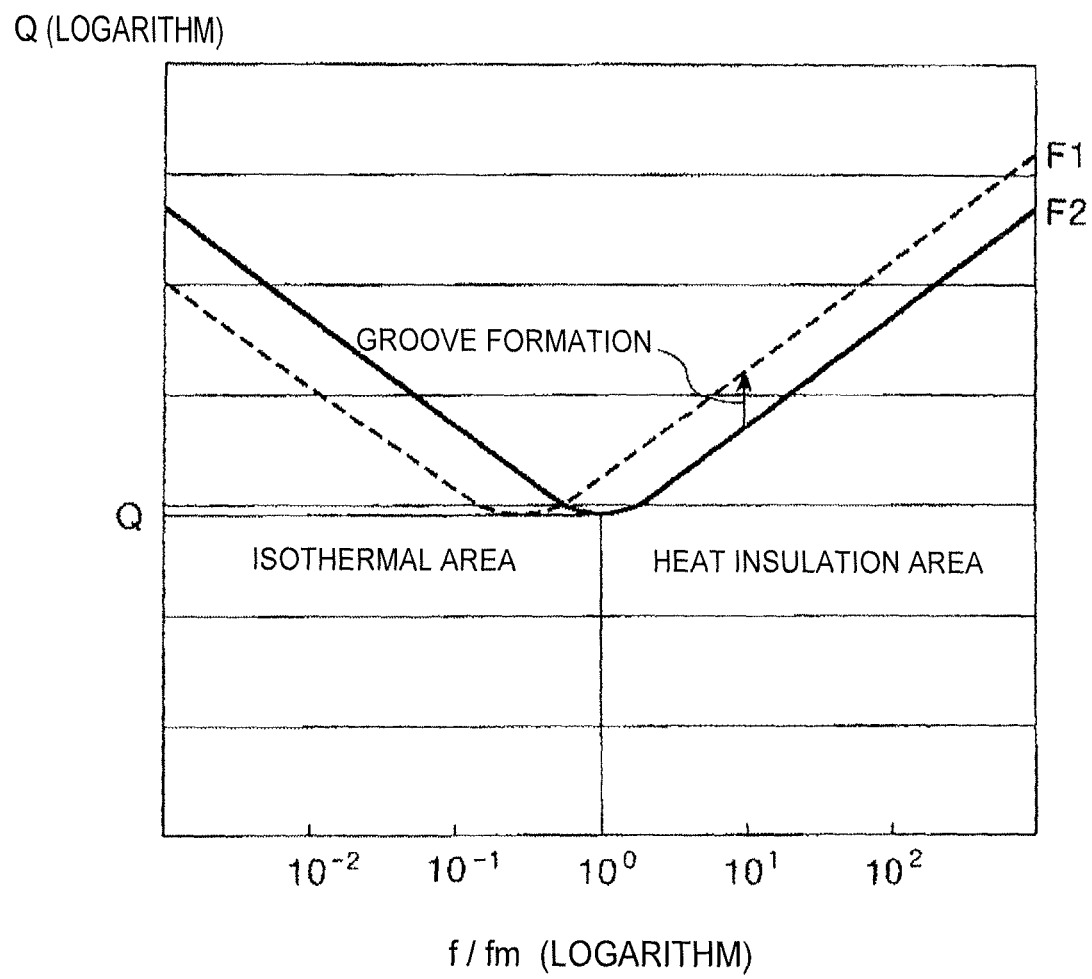
FIG. 8 is a graph showing a relationship between a Q value and f/fm.

1. Resonator (Resonator Element) and Frequency Adjustment Method of Resonator Element First Embodiment FIG. 1 is a plan view of a resonator according to a first embodiment of the invention. FIG. 2 is a cross-sectional view taken along line A-A of FIG. 1. FIG. 3 is a cross-sectional view taken along line B-B of FIG. 1. FIG. 4 is a cross-sectional view showing a vibrating arm formed by wet etching. FIGS. 5A and 5B are a plan view and a cross-sectional view showing a weight portion. FIGS. 6A and 6B are cross-sectional view showing an example of a specific configuration of the weight portion shown in FIGS. 5A and 5B. FIG. 7 is a cross-sectional view of the vibrating arm illustrating heat conduction at the time of flexural vibration. FIG. 8 is a graph showing a relationship between a Q value and f/fm. FIG. 9 to FIG. 12 are cross-sectional views illustrating a frequency adjustment method. Hereinafter, for convenience of description, the upper side of FIG. 2 is set as "up" and the lower side of FIG. 2 is set as "down". The upper side of FIG. 1 is set as a "distal end" and the lower side of FIG. 1 is set as a "proximal end".

Resonator (Resonator Element)

As shown in FIG. 1, a resonator 1 includes a resonator element 2, and a package 9 which accommodates the resonator element 2.

Package

As shown in FIG. 1 and FIG. 2, the package 9 includes a box-shaped base 91 including a recess 911 which is opened to an upper surface, and a plate-shaped lid 92 which is bonded to the base 91 so as to close the opening of the recess 911. The package 9 includes an accommodation space S which is formed by closing the recess 911 by the lid 92, and airtightly accommodates the resonator element 2 in the accommodation space S. An atmosphere in the accommodation space S is not particularly limited, but a depressurized state (vacuum state) is preferable. Accordingly, air resistance against excitation of the resonator element 2 is decreased, and therefore it is possible to exhibit excellent vibration characteristics. A degree of vacuum in the accommodation space S is not particularly limited, but is preferably approximately equal to or smaller than 100 Pa and is more preferably approximately equal to or smaller than 10 Pa. Inert gas such as nitrogen, helium, or argon may be sealed in the accommodation space S. The base 91 and the lid 92 may be bonded to each other by low-melting-point glass, various adhesives, or a metalized layer, for example.

A recess 912 is further formed on the bottom surface of the recess 911 which is formed on the base 91, and this recess 912 is provided in a position facing hammer heads 322 and 332 (distal end portion of the vibrating arms 32 and 33) of the resonator element 2 which will be described later. This recess 912 is, for example, configured as a clearance portion for preventing the contact of the bent vibrating arms 32 and 33 with the base 91, when acceleration (impact) in a thickness direction (Z axis direction) of the resonator is applied to the resonator 1. A constituent material of the base 91 is not particularly limited, and various ceramics such as aluminum oxide can be used.

The lid 92 can transmit laser light LL (energy beam), and therefore, the lid 92 is configured as a transmission portion which transmits the laser light LL. A constituent material of the lid 92 is not particularly limited, as long as it can transmit the laser light LL, and various glass materials such as borosilicate glass, quartz glass, or alkali-free glass, or transparent single-crystal material such as quartz crystal can be used, for example. Therefore, it is possible to obtain the lid 92 which is substantially colorless and transparent and has high laser transmittance.

In the embodiment, the lid 92 includes the transmission portion which transmits the laser light LL (energy beam), but when various glass materials such as borosilicate glass, quartz glass, or alkali-free glass, or transparent single-crystal material such as quartz crystal is used on the base 91, the base 91 can also include the transmission portion which transmits the laser light LL (energy beam).

Connection terminals 951 and 961 are formed on a bottom surface of the recess 911 of the base 91. A conductive adhesive 11 is provided on the connection terminal 951 and a conductive adhesive 12 is provided on the connection terminal 961. The resonator element 2 is fixed to the base 91, the connection terminal 951 is electrically connected to a first excitation electrode 84 which will be described later, and the connection terminal 961 is electrically connected to a second excitation electrode 85 which will be described later, with the conductive adhesives 11 and 12.

The conductive adhesives 11 and 12 are not particularly limited, as long as these both have conductivity and adhesiveness, and a conductive adhesive obtained by mixing conductive filler such as silver particles with an epoxy, acrylic, silicon, polyimide, bismaleimide, polyester, or polyurethane resin can be used. By using the comparatively soft adhesive as described above, it is possible to absorb and relax thermal stress generated from a difference of a coefficient of thermal expansion between the base 91 and the resonator element 2 by the conductive adhesives 11 and 12, for example, and it is possible to decrease degradation or a change of the vibration characteristics of the resonator element 2. A gold bump or solder may be used instead of the conductive adhesives 11 and 12, if it can fix the resonator element 2 to the base 91.

The connection terminal 951 is electrically connected to an external terminal 953 provided on a lower surface of the base 91, through a penetration electrode 952 which penetrates a bottom portion of the base 91, and the connection terminal 961 is electrically connected to an external terminal 963 provided on a lower surface of the base 91, through a penetration electrode 962 which penetrates the bottom portion of the base 91, in the same manner. The configuration of the connection terminals 951 and 961, the penetration electrodes 952 and 962, and the external terminals 953 and 963 is not particularly limited, as long as these have conductivity, and a configuration in which a plated layer of Au (gold), Ag (silver), or Cu (copper) is formed on a base layer of Cr (chrome), Ni (nickel), W (tungsten), or molybdenum (Mo) can be used.

Resonator Element

As shown in FIG. 1 to FIG. 3, the resonator element 2 includes a quartz crystal resonator blank (resonator blank) 3, the first and second excitation electrodes 84 and 85 provided on the quartz crystal resonator blank 3, and a weight portion 5 provided on the quartz crystal resonator blank 3. In FIG. 1 and FIG. 2, for convenience of description, the first and second excitation electrodes 84 and 85 and the weight portion 5 are omitted.

The quartz crystal resonator blank 3 is configured with a Z cut quartz crystal plate. The Z cut quartz crystal plate is a quartz crystal substrate substantially using a Z axis as a thickness direction. In the quartz crystal resonator blank 3, the thickness direction and the Z axis may coincide with each other, but the Z axis may be slightly inclined with respect to the thickness direction, in order to decrease a change in a frequency temperature around the room temperature. When the inclined angle is set as θ degrees (−5°≤θ≤15°), an X axis in a orthogonal coordinate system configured with the X axis as an electrical axis of the quartz crystal, a Y axis as a mechanical axis, and a Z axis as an optical axis, is set as a rotation axis, an axis obtained by inclining the Z axis by θ degrees so that the positive Z side thereof rotates in the negative Y direction of the Y axis is set as a Z' axis, and an axis obtained by inclining the Y axis by θ degrees so that the positive Y side thereof rotates in the positive Z direction of the Z axis is set as a Y' axis, a direction along the Z' axis is set as a thickness and a surface including the X axis and the Y' axis is used as a main surface in the quartz crystal resonator blank 3. The X axis, the Y axis, and the Z axis are shown in each drawing by assuming a case where the angle θ described above is 0°.

The quartz crystal resonator blank 3 has the Y axis direction as a length direction, the X axis direction as a width direction, and the Z axis direction as a thickness direction. The quartz crystal resonator blank 3 has substantially the same thickness substantially over the entire area (excluding areas where grooves 323, 324, 333, and 334 which will be described later are formed) thereof. A thickness T of the quartz crystal resonator blank 3 is not particularly limited, but is preferably approximately from 60 μm to 300 μm. Accordingly, as will be described later, it is possible to sufficiently widen the area of the first and second excitation electrodes 84 and 85 disposed on side surfaces of vibrating arms 32 and 33, and therefore, it is possible to sufficiently decrease a CI value. In addition, it is possible to secure a sufficient length of a heat transfer path (see FIG. 8) which will be described later, and therefore, it is possible to sufficiently decrease a thermoelastic loss in a heat insulation area which will be described later. When the thickness of the quartz crystal resonator blank is smaller than the lower limit value, since the quartz crystal resonator blank 3 is greatly bent when the acceleration (impact) in the thickness direction (Z axis direction) of the resonator is applied to the resonator 1, the bent vibrating arms 32 and 33 easily come in contact with the base 91 or the lid 92, and the impact is great due to a high speed at the time of the contact, and thus the vibrating arms 32 and 33 may be damaged. When the thickness thereof exceeds the upper limit value, it is difficult to create a fine shape by wet etching, and the excessively large size of the resonator element 2 may be obtained.

The quartz crystal resonator blank 3 includes a base portion 31, the pair of vibrating arms 32 and 33 which extend in the positive Y axis direction from the end (one end) of the base portion 31 on the positive Y axis side, a connection portion 34 which is disposed on the negative Y axis side of the base portion 31, and a linkage portion 35 which is positioned between the base portion 31 and the connection portion 34 and links between the base portion 31 and the connection portion 34. The base portion 31, the vibrating arms 32 and 33, the connection portion 34, and the linkage portion 35 are integrally formed from the quartz crystal substrate.

The base portion 31 has a plate shape having an expanse in an XY plane and having a thickness in the Z axis direction. The linkage portion 35 extends in the negative Y axis direction from the end of the base portion 31 on the negative Y axis side (the other end side). The connection portion 34 is connected to the end of the linkage portion 35 on the negative Y axis side, and the connection portion 34 extends to both sides of the X axis direction from the linkage portion 35.

In the resonator element 2, the connection portion 34 is attached to the base 91 by the conductive adhesives 11 and 12. As described above, it is possible to stably attach the resonator element 2 to the base 91 using the two conductive adhesives 11 and 12.

Herein, a width of the linkage portion 35 is smaller than that of the base portion 31. That is, the linkage portion 35 is constricted with respect to the base portion 31. In addition, it also can be said that the linkage portion 35 is formed by forming cut-out portions 31a and 31b which are formed on both edges of the base portion by partially constricting the dimension of the base portion 31 in the width direction, in a position sufficiently separated from the end portion of the base portion 31 on the side of the vibrating arms 32 and 33 (positive Y axis side). By providing such a linkage portion 35, it is possible to suppress transfer of vibration leakage occurring at the time of the flexural vibration of the vibrating arms 32 and 33 to the connection portion 34, and to suppress the CI value of the resonator element 2 to be low. That is, the resonator element 2 having excellent vibration characteristics is obtained, by providing the linkage portion 35.

Particularly, in the embodiment, a constriction portion 311 is provided on the end portion of the base portion 31 on the negative Y axis side. A width (length in the X axis direction) of the constriction portion 311 continuously decreases towards the negative Y axis side (as it is separated from the end of the base portion 31 on the positive Y axis side), along a center line Ly (Y axis) between the vibrating arms 32 and 33. The constriction portion 311 is provided symmetrically with respect to the center line Ly. By providing such a constriction portion 311, it is possible to suppress displacement (vibration) of the base portion 31 in the Y axis direction accompanied with the flexural vibration of the vibrating arms 32 and 33. As a result, it is possible to obtain the resonator element 2 with small vibration leakage.

In addition, by providing such a constriction portion 311, it is possible to increase a separated distance between the end of the base portion 31 interposed between the vibrating arms 32 and 33 on the positive Y axis side, and the end of the constriction portion 311 on the negative Y axis side which approaches the cut-out portion 31a (or cut-out portion 31b) and the linkage portion 35, compared to a case where the constriction portion 311 is not provided. Accordingly, a length of a transfer path for heat transfer occurring therebetween when the resonator element 3 performs the flexural vibration increases, and therefore, it is possible to decrease the thermoelastic loss. When flexural deformity is performed in the plane (in XY plane) so as to separate the two vibrating arms 32 and 33 from each other, for example, the temperature decreases due to the expansion of the end of the base portion 31 interposed between the vibrating arms 32 and 33 on the positive Y axis side, and the temperature increases due to the compression of the end of the constriction portion 311 on the negative Y axis side which approaches the cut-out portion 31a (or cut-out portion 31b) and the linkage portion 35. The heat is transferred from an area with the increased temperature towards an area with the decreased temperature. When the flexural deformity is performed in the plane so as to make the vibrating arms 32 and 33 approach each other, the area with the increased temperature and the area with the decreased temperature are switched to each other, and the heat is transferred in a reversed direction. When the heat is mutually transferred in a predetermined period by the flexural vibration, the thermoelastic loss occurs. In the heat insulation area which will be described later, as the length of the transfer path of the heat increases, the loss decreases, and therefore the effects described above are described.

In the embodiment, the outline of the constriction portion 311 is an arch, but there is no limitation as long as the operations described above are realized. For example, the outline of the constriction portion 311 may be formed stepwise with a plurality of straight lines, that is, a width (length in the X axis direction) thereof may decrease in a stepwise manner towards the negative Y axis side along the center line Ly, or the outline of the constriction portion 311 may be configured with stair-like steps by the plurality of straight lines.

The vibrating arms 32 and 33 are arranged in the X axis direction and extend in the positive Y axis direction from the end of the base portion 31 on the positive Y axis side so as to be in parallel with each other. Each of the vibrating arms 32 and 33 has a longitudinal shape, in which a proximal end (end on the negative Y axis side) thereof is set as a fixed end and a distal end (end on the positive Y axis side) thereof is set as a free end.

The vibrating arms 32 and 33 respectively include arms 321 and 331 which extend from the base portion 31, and the hammer heads (wide width portions) 322 and 332 as weight portions which are positioned on the distal end side of the arms 321 and 331 and widths of which are greater than those of the arms 321 and 331. As described above, by providing the hammer heads 322 and 332 on the distal end side of the vibrating arms 32 and 33, it is possible to shorten the vibrating arms 32 and 33 and to realize miniaturization of the resonator element 2. As it is possible to shorten the vibrating arms 32 and 33, it is possible to decrease a vibration velocity of the vibrating arms 32 and 33 when vibrating the vibrating arms 32 and 33 at the same frequency to be lower than that in the related art, and therefore, it is possible to decrease air resistance when the vibrating arms 32 and 33 are vibrated, and the Q value increases to that extent, and it is possible to improve the vibration characteristics. When considering the fixed predetermined length (length in the Y axis direction) and fixed predetermined vibration frequency, it is possible to increase the width (length in the X axis direction) of the arms 321 and 331 so as to return the vibration frequency decreased due to the hammer heads 322 and 332 to the initial vibration frequency, and accordingly, it is possible to increase the length of the transfer path of the heat generating due to the flexural vibration. Therefore, it is possible to decrease the thermoelastic loss in the heat insulation area which will be described later, the Q value increases to that extent, and it is possible to improve the vibration characteristics.

Herein, a separated distance W7 between the hammer heads 322 and 332 is not particularly limited, but it is preferable to satisfy a relationship of 0.033 T (μm)≤W7≤0.33 T (μm) with respect to a thickness T (μm) of the quartz crystal resonator blank 3, for example. Accordingly, when forming the quartz crystal resonator blank 3 using a photolithography technology and a wet etching technology, a relationship between the separated distance W7 between the hammer heads 322 and 332 and the thickness T of the vibrating arms 32 and 33 (hammer heads 322 and 332) is optimized, and as a result, the microminiaturized quartz crystal resonator blank 3 is formed.

Hereinafter, the vibrating arms 32 and 33 will be described, but the vibrating arms 32 and 33 have the same configuration, and therefore, hereinafter, the vibrating arm 32 will be described as a representative, and the description of the vibrating arm 33 will be omitted.

As shown in FIG. 3, the arm 321 includes a pair of main surfaces 32a and 32b which are configured with the XY plane in a front-back relationship, and a pair of side surfaces 32c and 32d which are configured with the YZ plane and connect the pair of main surfaces 32a and 32b. The arm 321 includes a bottomed groove 323 opened to the main surface 32a and a bottomed groove 324 opened to the main surface 32b. As described above, by forming the grooves 323 and 324 in the vibrating arm 32, it is possible to decrease the thermoelastic loss and to exhibit the excellent vibration characteristics. A length of the grooves 323 and 324 is not particularly limited, and a distal end thereof may extend to the hammer head 322 or a proximal end thereof may extend to the base portion 31. With the configuration described above, stress concentration on the boundary of the arm 321 and the hammer head 322 and the boundary of the arm 321 and the base portion 31 is relaxed, and a concern of fracture or cracks occurring when the impact is applied, decreases. The groove may be provided only on any one of the main surfaces 32a and 32b or may be omitted.

A depth t of the grooves 323 and 324 preferably satisfies a relationship of 0.292≤t/T≤0.483. When the relationship is satisfied, the length of the heat transfer path increases, and accordingly, it is possible to more efficiently decrease the thermoelastic loss in the heat insulation area which will be described later. The depth t more preferably satisfies a relationship of 0.455≤t/T≤0.483. When the relationship is satisfied, the length of the heat transfer path further increases, and accordingly, it is possible to decrease the thermoelastic loss. Therefore, it is possible to realize the improvement of the Q value, the decrease of the CI value accompanied therewith, and the decrease of the CI value by further widening an electrode area for applying an electrical field in a flexural deformity area.

When manufacturing the quartz crystal resonator blank 3 with a patterning by the wet etching of the quartz crystal substrate, the cross-sectional shape of the arm 321 is a shape in which a quartz crystal plane of the quartz crystal is exposed, as shown in FIG. 4. Specifically, since an etching rate in the negative X axis direction is lower than an etching rate in the positive X axis direction, the side surface in the negative X axis direction is comparatively gently inclined, and the side surface in the positive X axis direction is almost vertically inclined. As shown in FIG. 4, the depth t of the grooves 323 and 324 in this case is the depth in the deepest position. Herein, as shown in FIG. 4, the grooves 323 and 324 preferably include bottom surfaces 323a and 324a configured with the XY plane. Accordingly, it is possible to further increase the length of the heat transfer path, and it is possible to efficiently decrease the thermoelastic loss in the heat insulation area.

The grooves 323 and 324 are preferably formed by adjusting the position in the X axis direction with respect to the vibrating arm 32, so that the center of gravity of the cross section of the vibrating arm 32 coincides with the center of cross-sectional shape of the vibrating arm 32. By doing so, the unnecessary vibration (specifically, vibration having an out-of-plane direction component) of the vibrating arm 32 decreases, and accordingly, it is possible to decrease the vibration leakage. In this case, the excitation of the unnecessary vibration is reduced, and therefore, it is possible to relatively enlarge the excitation area and to decrease the CI value.

A width (length in the X axis direction) W4 of the arm 321 is not particularly limited, but is preferably approximately from 13 μm to 300 μm and more preferably approximately from 30 μm to 150 μm. When the width W4 is smaller than the lower limit value, it is difficult to form the grooves 323 and 324 in the arm 321 by the manufacturing technology, and when the vibration frequency is in a range of 32.768 kHz ±1 kHz, the vibrating arm 32 may not be the heat insulation area, and the thermoelastic loss may be increased due to the formation of the groove 323 or the groove 324. Meanwhile, when the width W4 exceeds the upper limit value, the rigidity of the arm 321 excessively increases depending on the thickness T of the quartz crystal resonator blank 3, and the flexural vibration of the arm 321 may not be smoothly performed according to the decrease in excitation power due to the low power consumption. As the vibrating arm 32 becomes heavy, fixing strength due to the conductive adhesives 11 and 12 is insufficient, and the resonator element 2 may be detached from the base 91 when the impact is applied. The width W4 herein is a width of a portion which is positioned in the center of the arm 321 and extends with the substantially constant width, and is not a width of a tapered portion which is positioned on both end portions.

When the total length (length in the Y axis direction) of the vibrating arm 32 is set as L and the total length (length in the Y axis direction) of the hammer head 322 is set as H, it is preferable to satisfy a relationship of $0.183 \leq H/L \leq 0.597$, and it is more preferable to satisfy a relationship of $0.238 \leq H/L \leq 0.531$. Accordingly, the miniaturized resonator element 2 with the improved vibration characteristics is obtained. In addition, since it is possible to sufficiently secure the area of the hammer head 322, it is possible to dispose the weight portion 5 having sufficient mass on the hammer head 322.

A width (length in the X axis direction) W5 of the hammer head 322 is not particularly limited, but is preferably from 1.5 times to 10 times the width W4 of the arm 321. That is, a relationship of $1.5W4 \leq W5 \leq 10W4$ is preferably satisfied. Accordingly, it is possible to sufficiently secure a great width of the hammer head 322. Thus, even when the length H of the hammer head 322 is comparatively small, it is possible to sufficiently exhibit the mass effect by the hammer head 322. Therefore, it is possible to suppress the total length L of the vibrating arm 32 and to realize the miniaturization of the resonator element 2. In addition, since it is possible to sufficiently secure the area of the hammer head 322, it is possible to dispose the weight portion 5 having sufficient mass on the hammer head 322. Since the flexural vibration is not pure in-plane vibration, the hammer head 322 may be greatly twisted and the vibration leakage may be increased at the time of the flexural vibration of the vibrating arm 32, as the W5 increases; however, this concern can be reduced.

First and Second Excitation Electrodes

As shown in FIG. 3, the pair of first excitation electrodes 84 and the pair of second excitation electrodes 85 are formed in the vibrating arm 32 included in the quartz crystal resonator blank 3. One of the first excitation electrodes 84 is formed on the inner surface of the groove 323 and the other one thereof is formed on the inner surface of the groove 324. One of the second excitation electrodes 85 is formed on the side surface 32c and the other one thereof is formed on the side surface 32d. In the same manner as described above, the pair of first excitation electrodes 84 and the pair of second excitation electrodes 85 are also formed in the vibrating arm 33. One of the first excitation electrodes 84 is formed on the side surface 33c and the other one thereof is formed on the side surface 33d. One of the second excitation electrodes 85 is formed on the inner surface of the groove 333 and the other one thereof is formed on the inner surface of the groove 334.

Each of the first excitation electrodes 84 is extracted to a connection electrode 86 provided on the lower surface of the connection portion 34 by a wiring (not shown), and is electrically connected to the connection terminal 951 through the conductive adhesive 11 by the connection electrode 86. In the same manner as described above, each of the second excitation electrodes 85 is extracted to a connection electrode 87 provided on the lower surface of the connection portion 34 by a wiring (not shown), and is electrically connected to the connection terminal 961 through the conductive adhesive 12 by the connection electrode 87. When an alternating voltage is applied between the first and second excitation electrodes 84 and 85, the vibration of the vibrating arms 32 and 33 is performed in the X reversed-phase mode which is the flexural vibration mode mainly for the displacement of the X axis direction, so that the vibrating arms 32 and 33 repeatedly approach and are separated from each other.

The constituent material of the first and second excitation electrodes 84 and 85 is not particularly limited as long as it has conductivity, and a configuration in which a coating layer of Au (gold), Ag (silver), or Cu (copper) is formed on a base layer of Cr (chrome), Ni (nickel), W (tungsten), or molybdenum (Mo) can be used.

As the specific configuration of the first and second excitation electrodes 84 and 85, a configuration in which an Au layer having a thickness of 700 Å or less is formed on a Cr layer having a thickness of 700 Å or less can be used, for example. Particularly, since Cr or Au has the great thermoelastic loss, the thickness of the Cr layer and the Au layer is preferably 200 Å or less. When increasing the insulation breakdown resistance, the thickness of the Cr layer and the Au layer is preferably 1000 Å or more. In addition, since the coefficient of thermal expansion of Ni is close to the coefficient of thermal expansion of the quartz crystal, by using the Ni layer instead of the Cr layer as a base, it is possible to decrease thermal stress due to the electrode and to obtain the resonator element having an excellent long-term reliability (aging property).

Weight Portion

The weight portion 5 is respectively provided on the hammer heads 322 and 332 of the vibrating arms 32 and 33. The weight portion 5 is used for adjusting a resonance frequency of the resonator element 2. A configuration of the weight portion 5 of the vibrating arm 32 is the same as a configuration of the weight portion 5 of the vibrating arm 33, and therefore, hereinafter, the weight portion 5 provided on the vibrating arm 32 will be described as a representative, and the description regarding the weight portion 5 provided on the vibrating arm 33 will be omitted.

As shown in FIGS. 5A and 5B, the weight portion 5 is provided on the hammer head 322. By providing the weight portion 5 on the hammer head 322 as described above, it is possible to increase adjustment efficiency of the resonance frequency (ratio of a frequency change to a removed amount of the weight portion 5). In addition, by providing the weight portion 5 on the hammer head 322, it is possible to secure a wide formation area of the first and second excitation electrodes 84 and 85, and therefore, it is possible to prevent a decrease in excitation efficiency (for example, the CI value) of the resonator element 2.

The weight portion 5 is provided on the main surface 32b, that is, a main surface positioned on the opposite side of the lid 92. The weight portion 5 includes a first weight portion 51, and a second weight portion 52 provided on the proximal end side (base portion 31 side) with respect to the first weight portion 51. A thickness of the second weight portion 52 is smaller than that of the first weight portion 51. As will be described later, the first weight portion 51 is a weight portion for performing coarse adjustment of the resonance frequency of the resonator element 2, and the second weight portion is a weight portion for performing fine adjustment of the resonance frequency of the resonator element 2. As described above, since the weight portion 5 includes the first weight portion 51 for coarse adjustment and the second weight portion 52 for fine adjustment, it is possible to efficiently and accurately adjust the resonance frequency of the resonator element 2.

The weight portion 5 is configured with a laminated body of a first weight layer 5A and a second weight layer 5B from the lower surface side of the hammer head 322. The first weight layer 5A is disposed over substantially the entire lower surface of the hammer head 322, and the second weight layer 5B has a length shorter than that of the first weight layer 5A and is disposed to be biased to the distal end side so as to exclude the proximal end portion of the hammer head 322. That is, the weight portion 5 includes a first portion which is positioned on the distal end side in the length direction of the weight portion and where the first weight layer 5A and the second weight layer 5B are overlapped with each other, and a second portion which is positioned on the proximal end side and where the first weight layer 5A is provided as a single layer. The first portion configures the first weight portion 51 and the second portion configures the second weight portion 52. With the configuration described above, the configuration of the first and second weight portions 51 and 52 is simplified.

When a thickness of the first weight layer 5A is set as t1 and a thickness of the second weight layer 5B is set as t2, it is preferable to satisfy a relationship of 2×t1≤t2 ≤70×t1 and it is more preferable to satisfy a relationship of 5×t1≤t2≤50×t1. Accordingly, it is possible to form the sufficiently thick first weight portion 51, and meanwhile, it is possible to form the sufficiently thin second weight portion 52. Thus, the first weight portion 51 has a thickness which is further suitable for the coarse adjustment of the resonance frequency, and the second weight portion 52 has a thickness which is further suitable for the fine adjustment of the resonance frequency. Therefore, it is possible to more efficiently and accurately adjust the resonance frequency of the resonator element 2. The thickness t1 of the first weight layer 5A is not particularly limited, but is preferably from 10 Å to 3000 Å and more preferably from 10 Å to 1000 Å. Accordingly, it is possible to set the thickness of the first weight layer 5A to be sufficiently small, and the thickness thereof is suitable for the second weight portion 52 used in the fine adjustment of the resonance frequency. The sum (=t1+t2) of the thicknesses t1 and t2 of the first and second weight layers 5A and 5B is not particularly limited, but is preferably equal to or smaller than 5 μm, for example, in order to prevent excessive increase in the thickness of the weight portion 5.

When a length of the first weight portion 51 in an extension direction (Y axis direction) of the vibrating arm 32 is set as L1 and a length of the second weight portion 52 in the extension direction (Y axis direction) of the vibrating arm 32 is set as L2, it is preferable to satisfy the following equation (1) and it is more preferable to satisfy the following equation (2). Therefore, it is possible to dispose the first weight portion 51 and the second weight portion 52 to be balanced. The first weight portion 51 is used in the coarse adjustment of the resonance frequency of the resonator element 2 and the second weight portion 52 is used in the fine adjustment of the resonance frequency of the resonator element 2. Thus, by disposing the first and second weight portions 51 and 52 to be balanced, it is possible to sufficiently perform the coarse adjustment and the fine adjustment and to efficiently and accurately perform the frequency adjustment of the resonator element 2.

$$0.1 \le \frac{L1}{L1 + L2} \le 0.8 \quad (1)$$

$$0.3 \le \frac{L1}{L1 + L2} \le 0.6 \quad (2)$$

A formation method of the first and second weight layers 5A and 5B is not particularly limited, and a sputtering method or a vapor deposition method can be used, for example. In the embodiment, the first weight layer 5A is formed by the sputtering method and the second weight layer 5B is formed by the vapor deposition method. Since a film is formed in a high vacuum state when forming the film by the vapor deposition method, the film formed by the vapor deposition method has a smaller outgassing (degassing) amount generated when removing the film with the emission of the laser light LL, compared to the film formed by the sputtering method. Accordingly, as will be described later, when adjusting the resonance frequency of the resonator element 2 in a state of being accommodated in the package 9, it is possible to suppress a decrease in a degree of vacuum in the accommodation space S of the package due to the outgassing. In the same manner as the second weight layer 5B, the effect of the first weight layer 5A will be further improved when the first weight layer is also formed by the vapor deposition method. However, in a case of forming the first weight layer 5A on the surface of the quartz crystal resonator blank 3 by the vapor deposition method, a longer time is required for the process compared to a case using the sputtering method, and an accuracy of the film thickness is generally low. Accordingly, in the embodiment, the first weight layer 5A is formed by the sputtering method, by considering ease of the formation. As described above, since the first weight layer 5A is formed to have the comparatively and sufficiently smaller thickness than that of the second weight layer 5B, the generation amount of the outgassing is suppressed.

As shown in FIG. 6A, as for a specific configuration of the first and second weight layers 5A and 5B, for example, the first weight layer 5A, as a base layer, which is configured with Cr (chrome) and is formed by the sputtering method, and the second weight layer 5B which is configured with Au (gold) and is formed by the vapor deposition method can be stacked on each other. As shown in FIG. 6B, the first weight layer 5A may be configured with two layers. Specifically, the first weight layer 5A may have a configuration in which a base layer 5A1 which is configured with Cr and is formed by the sputtering method and a coating layer 5A2 which is configured with Au and is formed by the vapor deposition method are stacked on each other. In the configuration of FIG. 6A, the first weight layer 5A is configured with a single layer, and accordingly, it is advantageous to have the thinner first weight layer 5A compared to the configuration of FIG. 6B, but it is disadvantageous for an oxide film to be formed on the surface of the first weight layer 5A. Meanwhile, according to the configuration of FIG. 6B, although it is disadvantageous to have the thicker first weight layer 5A compared to the configuration of FIG. 6A, it is possible to prevent the formation of the oxide layer on the surface of the first weight layer 5A. In both cases of FIGS. 6A and 6B, it is possible to form the first weight layer 5A by the same step as in the case of the first and second excitation electrodes 84 and 85. Therefore, it is possible to prevent complicated manufacturing of the resonator element 2.

Hereinabove, the weight portion 5 has been described in detail. Herein, since the quartz crystal resonator blank 3 is substantially colorless and transparent, the vibrating arm 32 (hammer head 322) can transmit the laser light LL. As shown in FIG. 5B, the first and second excitation electrodes 84 and 85 or the weight portion 5 is not formed on the main surface 32a (main surface on the lid 92 side) of the hammer head 322. Accordingly, the material thereof is exposed from the main surface 32a of the hammer head 322. The main surface 32a of the hammer head 322 is a laser incidence area (area) SLL where the incidence of the laser light LL to the inside of the hammer head 322 is allowed.

In a plan view (plan view when seen in the Z axis direction), the laser incidence area (area) SLL includes a first laser incidence area SLL1 which is provided in a position overlapped with the first weight portion 51 and a second laser incidence area SLL2 which is provided in a position overlapped with the second weight portion 52. Accordingly, it is possible to perform the incidence of the laser light LL to the first weight portion 51 from the first laser incidence area SLL1 by transmitting the hammer head 322, and in the same manner, it is possible to perform the incidence of the laser light to the second weight portion 52 from the second laser incidence area SLL2 by transmitting the hammer head 322. As described above, by emitting the laser light LL from the main surface 32a side of the hammer head 322 and removing the first and second weight portions 51 and 52, it is possible to reduce reattachment of the removed weight material to the resonator element 2. This will be described in detail in the frequency adjustment method which will be described later.

Particularly, as described above, since the material of the hammer head 322 (surface of the quartz crystal resonator blank 3) is exposed in the laser incidence area SLL, it is possible to increase incidence efficiency of the laser light LL into the hammer head 322. If any layer is formed on the main surface 32a of the hammer head 322, the layer is evaporated by the laser light LL, and this may cause the decrease in the degree of vacuum in the package 9.

Hereinabove, the configuration of the resonator element 2 has been described. As described above, by forming the grooves 323, 324, 333, and 334 in the vibrating arms 32 and 33 of the resonator element 2, it is possible to decrease the thermoelastic loss and to exhibit the excellent vibration characteristics. Hereinafter, these effects will be specifically described using the vibrating arm 32 as an example.

As described above, the vibrating arm 32 performs flexural vibration in the in-plane direction by applying the alternating voltage between the first and second excitation electrodes 84 and 85. As shown in FIG. 7, at the time of the flexural vibration, when the side surface 32c of the arm 321 is contracted, the side surface 32d thereof is expanded, and in contrast, when the side surface 32c thereof is expanded, the side surface 32d thereof is contracted. When the Gough-Joule effect of the vibrating arm 32 does not occur (energy elasticity is dominant over entropy elasticity), the temperature of the contracting surface side among the side surfaces 32c and 32d increases, and the temperature of the expanding surface side decreases. Accordingly, a difference in a temperature between the side surface 32c and the side surface 32d, that is, the inner portion of the arm 321, is generated. A loss of a vibration energy occurs by the heat conduction occurring from the difference in the temperature, and accordingly, the Q value of the resonator element 2 decreases. The loss of the energy accompanied with the decrease of the Q value is also referred to as the thermoelastic loss.

In a resonator element which vibrates in a flexural vibration mode having the configuration of the resonator element 2, when a flexural vibration frequency (mechanical flexural vibration frequency) f of the vibrating arm 32 is changed, the Q value becomes the minimum value when the flexural vibration frequency of the vibrating arm 32 coincides with a thermal relaxation frequency fm. The thermal relaxation frequency fm can be acquired by the following equation (3). Herein, in the equation (3), π represents a circular constant, and when e is set as a Napier's constant, τ represents relaxation time necessary for obtaining the difference in the temperature to be $e^{-1}$ times by the heat conduction.

$$fm = \frac{1}{2\pi\tau} \quad (3)$$

When the heat relaxation frequency of the flat plate structure (structure of the rectangular cross-sectional shape) is set as fm0, the fm0 can be acquired by the following equation (4).

In the equation (4), π represents a circular constant, k represents thermal conductivity of the vibrating arm 32 in the vibration direction, ρ represents the mass density of the vibrating arm 32, Cp represents thermal capacity of the vibrating arm 32, and a represents the width of the vibrating arm 32 in the vibration direction. When the constants of the material of the vibrating arm 32 (that is, quartz crystal) are input to the thermal conductivity k, the mass density ρ, and the thermal capacity Cp of the equation (4), the heat relaxation frequency fm0 to be acquired is a value in a case where the grooves 323 and 324 are not provided in the vibrating arm 32.

$$fm0 = \frac{\pi k}{2\rho Cp a^2} \quad (4)$$

The grooves 323 and 324 are formed in the vibrating arm 32 so as to be positioned between the side surfaces 32c and 32d. Accordingly, the heat transfer path for balancing the difference in the temperature between the side surfaces 32c and 32d occurring at the time of the flexural vibration of the vibrating arm 32 by the heat conduction is formed so as to bypass the grooves 323 and 324, and the length of the heat transfer path increases more than the direct distance (shortest distance) between the side surfaces 32c and 32d. Thus, the relaxation time τ increases and the thermal relaxation frequency fm decreases, compared to a case where the grooves 323 and 324 are not provided in the vibrating arm 32.

FIG. 8 is a graph showing f/fm dependency of the Q value of the resonator element in the flexural vibration mode. In the drawing, a curve F1 shown with a dotted line shows a case where the grooves are formed in the vibrating arm as in the resonator element 2, and a curve F2 shown with a solid line shows a case where the grooves are not formed in the vibrating arm. In the drawing, the shape of the curves F1 and F2 does not change, but the curve F1 is shifted with respect to the curve F2 in a frequency decreasing direction, according to the decrease in the thermal relaxation frequency fm described above. Accordingly, when the thermal relaxation frequency in a case where the grooves are formed in the vibrating arm as in the resonator element 2 is set as fm1 and the following equation (5) is satisfied, the Q value of the resonator element in which the grooves are formed in the vibrating arm is constantly higher than the Q value of the resonator element in which the grooves are not formed in the vibrating arm.

$$f > \sqrt{fm0 fm1} \quad (5)$$

When the relationship is limited to the relationship of the following equation (6), it is possible to obtain the higher Q value.

$$\frac{f}{fm0} > 1 \quad (6)$$

In FIG. 8, an area satisfying the relationship of f/fm<1 is also referred to as an isothermal area, and the Q value increases as the value of f/fm decreases, in this isothermal area. This is because the difference in the temperature in the vibrating arm described above is difficult to be generated, as the mechanical frequency of the vibrating arm decreases (vibration of the vibrating arm is delayed). Accordingly, when the f/fm approaches 0 without limit, a quasi-isothermal operation is performed, and the thermoelastic loss approaches 0 without limit. Meanwhile, an area satisfying the relationship of f/fm>1 is also referred to as the heat insulation area, and the Q value increases as the value of f/fm increases, in this heat insulation area. This is because a speed of switching of the temperature increase and the temperature decrease of each side surface is high and the time for the heat conduction described above decreases, as the mechanical frequency of the vibrating arm increases. Accordingly, when the f/fm increases without limit, a heat insulation operation is performed, and the thermoelastic loss approaches 0 without limit. Therefore, to satisfy the relationship of the f/fm>1 can be, in other words, to have the value of f/fm in the heat insulation area.

Frequency Adjustment Method of Resonator Element

Next, a method of adjusting the resonance frequency of the resonator element 2 described above will be described with reference to FIG. 9 to FIG. 12. Hereinafter, for convenience of description, a case of removing the weight portion 5 provided on the vibrating arm 32 will be described as a representative, but the weight portion 5 provided on the vibrating arm 33 is also removed in the same manner.

The resonance frequency adjustment method includes a coarse adjustment step of performing coarse adjustment of the resonance frequency of the resonator element 2 before accommodating the resonator element in the package 9, an accommodation step of accommodating the resonator element 2 subjected to the coarse adjustment in the package 9, a first adjustment step of adjusting (coarse adjustment) the resonance frequency of the resonator element 2 in the package 9 using the first weight portion 51, and a second adjustment step of adjusting (fine adjustment) the resonance frequency of the resonator element 2 in the package 9 using the second weight portion 52.

Coarse Adjustment Step

Figure 9:
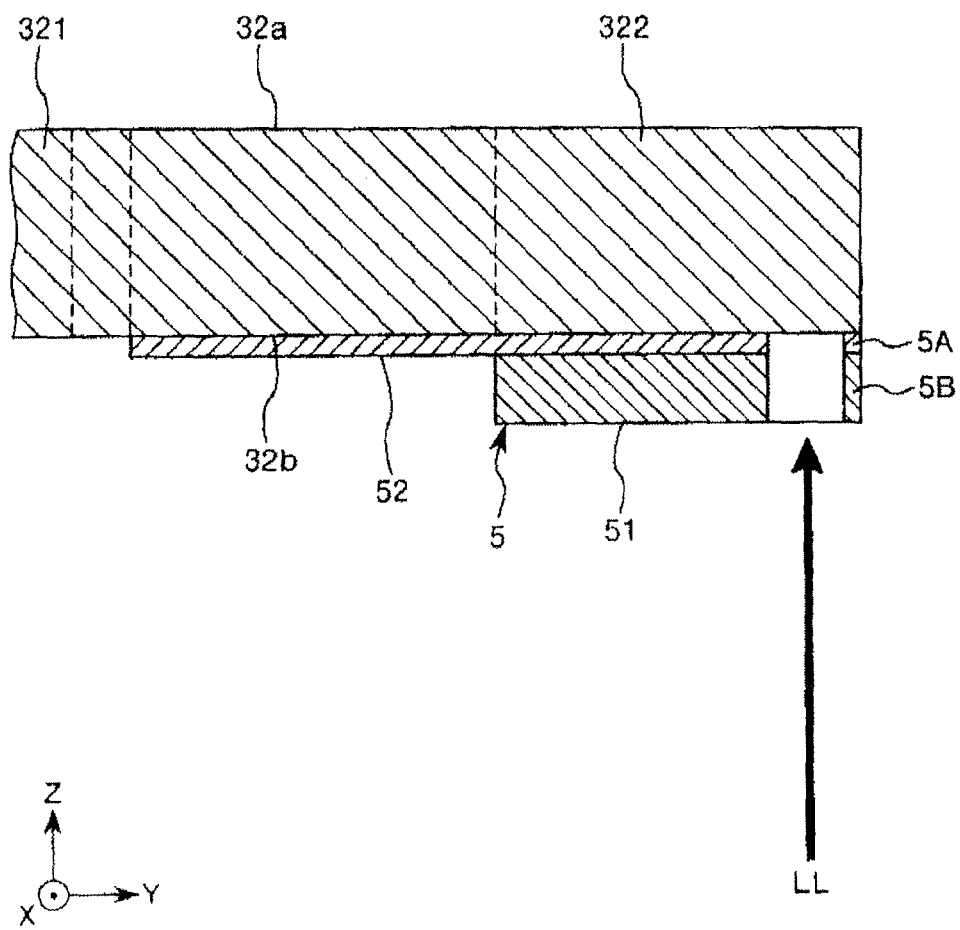
FIG. 9 is a cross-sectional view illustrating a frequency adjustment method.

First, as shown in FIG. 9, the laser light LL is incident to the distal end side of the first weight portion 51 and a part of the first weight portion 51 is removed, in a state where the resonator element 2 is driven. Accordingly, the resonance frequency of the resonator element 2 roughly approaches a target value. That is, coarse adjustment is performed. Since a ratio of a frequency change to the incidence time of the laser light LL (removed amount of the weight portion) is great on the distal end side of the first weight portion 51, it is possible to more efficiently perform the coarse adjustment of the resonance frequency. In FIG. 9, the laser light LL is emitted from the main surface 32b side of the hammer head 322 (front surface side of the first weight portion 51), but the laser light LL may be emitted from the main surface 32a side of the hammer head 322 (rear surface side of the first weight portion 51). That is, the laser light LL may be incident to the first weight portion 51 from the first laser incidence area SLL1 by transmitting the hammer head 322. This step can be performed in a state where the resonator element 2 is held on a wafer. That is, this step can be performed before breaking off the resonator element 2 from the wafer. This step may be performed in a state of being exposed to the atmosphere and may be performed in a state with the reduced pressure. Particularly, in the former case, a deviation of the resonance frequency due to air resistance occurs, but it is possible to more simply adjust the resonance frequency.

Accommodation Step

Figure 10:
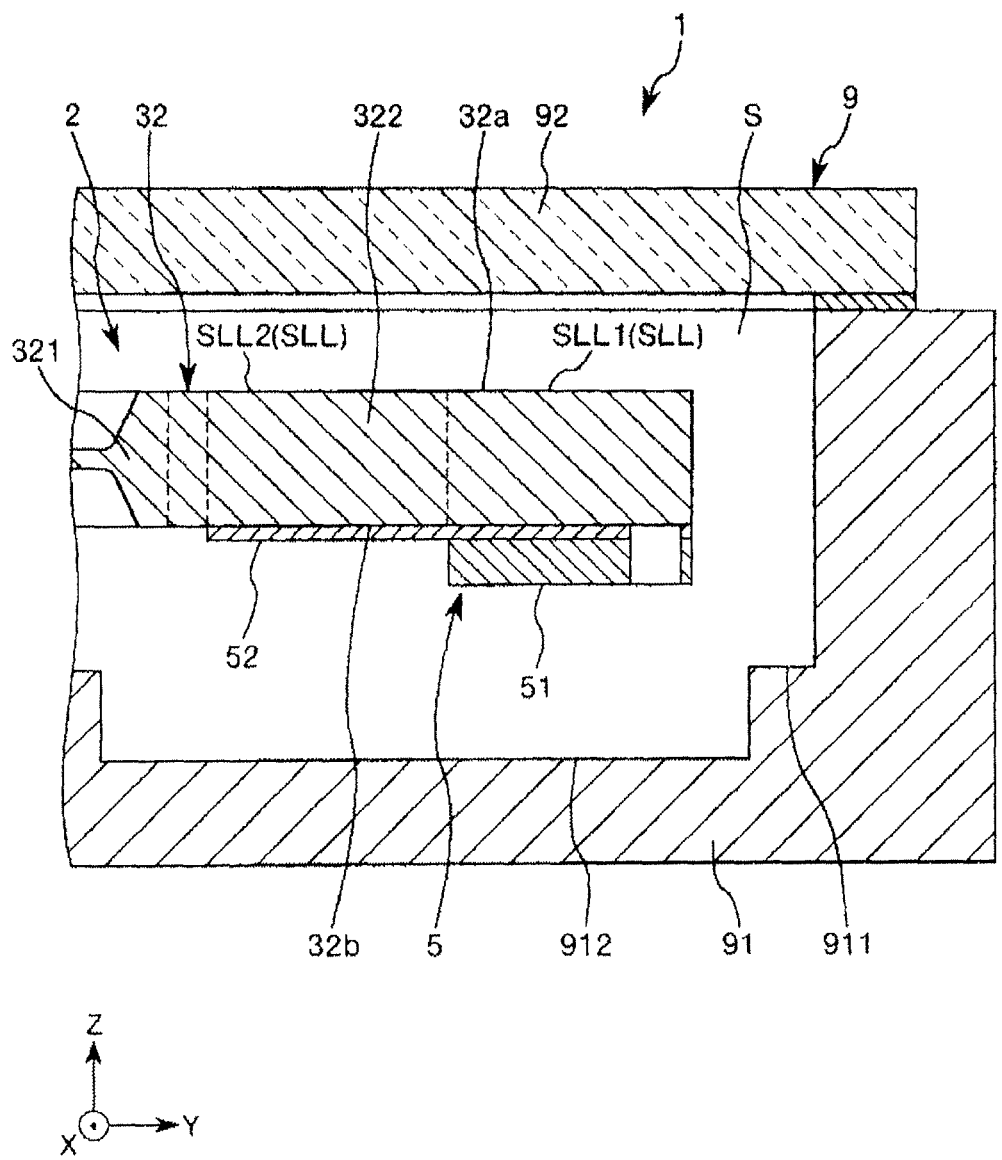
FIG. 10 is a cross-sectional view illustrating a frequency adjustment method.

Next, as shown in FIG. 10, the resonator element 2 subjected to the coarse adjustment is accommodated in the package 9 (that is, fixed to the base 91 with the conductive adhesives 11 and 12) and the state in the package 9 is set to a vacuum state. In a state where the resonator element 2 is accommodated, the main surface 32b which is on the side where the first and second weight portions 51 and 52 of the resonator element 2 are disposed, is positioned on the base 91 side, and the main surface 32a which is on the side where the laser incidence area SLL is provided, is positioned on the lid 92 side. The lid 92 and the laser incidence area SLL face each other. With such disposition, as will be described later, it is possible to perform the incidence of the laser light LL to the first and second weight portions 51 and 52 through the lid 92 and the hammer head 322.

First Adjustment Step

Figure 11:
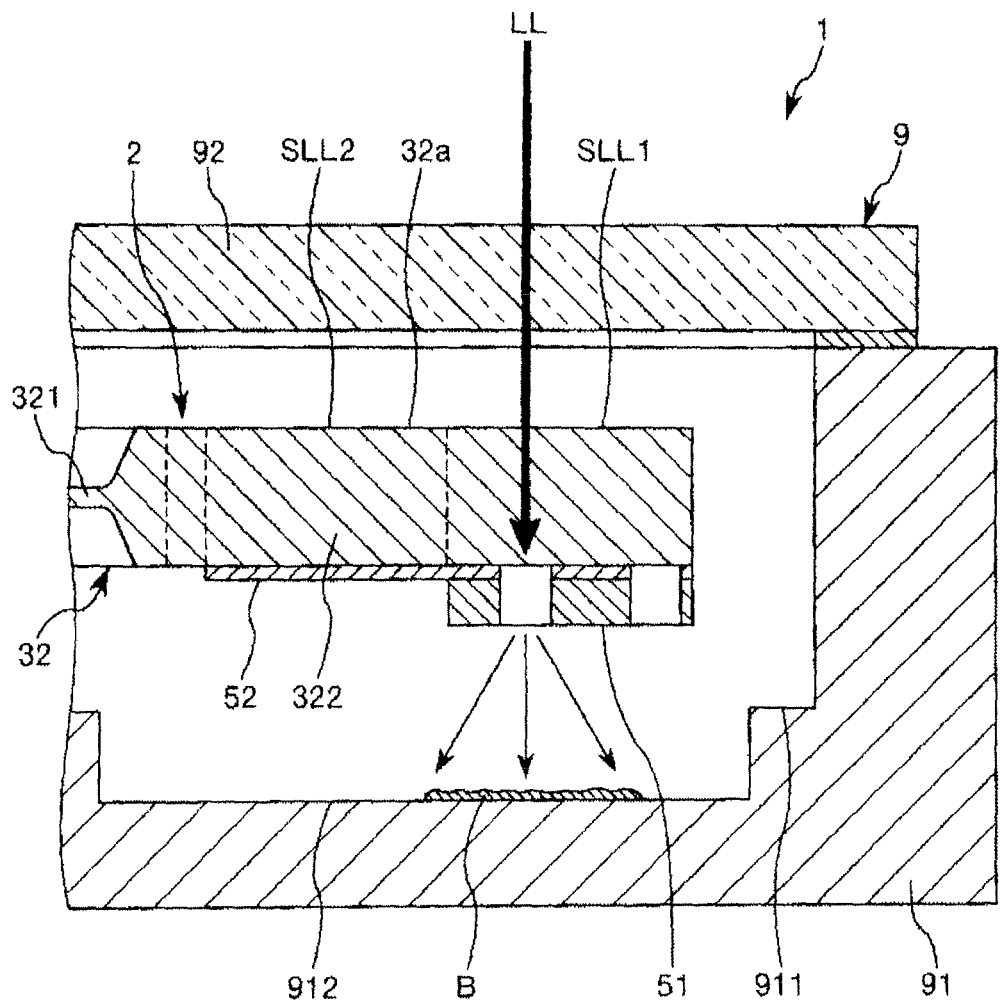
FIG. 11 is a cross-sectional view illustrating a frequency adjustment method.

Next, as shown in FIG. 11, the laser light LL is incident to the first weight portion 51 from the lid 92 side, and at least a part of the first weight portion 51 is removed, in a state where the resonator element 2 is driven. Specifically, the laser light LL is introduced into the package 9 through the lid 92 and is transmitted through the hammer head 322 from the first laser incidence area SLL1 so as to be incident to the first weight portion 51 from the rear side, and accordingly, a part of the first weight portion 51 is removed. At that time, the area to which the laser light LL is incident, is preferably positioned on the proximal end side with respect to the area to which the laser light LL is incident in the coarse adjustment step described above. Accordingly, the ratio of the frequency change to the incidence time of the laser light LL (removed amount of the weight portion) decreases to be lower than that in the coarse adjustment step. The resonance frequency of the resonator element 2 further approaches the target value by performing the first adjustment step described above. It can be said that this step is a coarse adjustment step of comparatively coarsely adjusting the resonance frequency, although it is less than that in the coarse adjustment step.

In this step, a weight material B removed from the first weight portion 51 is scattered in the package 9 and most of the weight material is attached to the bottom surface of the recess 911 or the inner surface of the recess 912 which is disposed to face the first weight portion 51. Accordingly, the attachment of the scattered weight material B to the inner surface of the lid 92 by moving around the resonator element 2, is suppressed. As a result, as described in the related art, it is possible to efficiently suppress scattering of the weight material B attached to the inner surface of the lid 92 by the laser light LL and the reattachment of the weight material to the vibrating arm 32. Therefore, according to this step, it is possible to efficiently and accurately perform the frequency adjustment. Particularly, since the bottom surface of the recess 911 or the inner surface of the recess 912 is positioned on the opposite side of the lid 92 with the resonator element 2 interposed therebetween, it is difficult to emit the laser light LL. Accordingly, the weight material B attached to the bottom surface of the recess 911 or the inner surface of the recess 912 once is hardly scattered again, and thus the reattachment of the weight material to the vibrating arm 32 as described above is reduced. Particularly, when a direction of the incidence of the laser light LL and a direction of acceleration of gravity are the same, a concern of the reattachment is further reduced.

Second Adjustment Step

Figure 12:
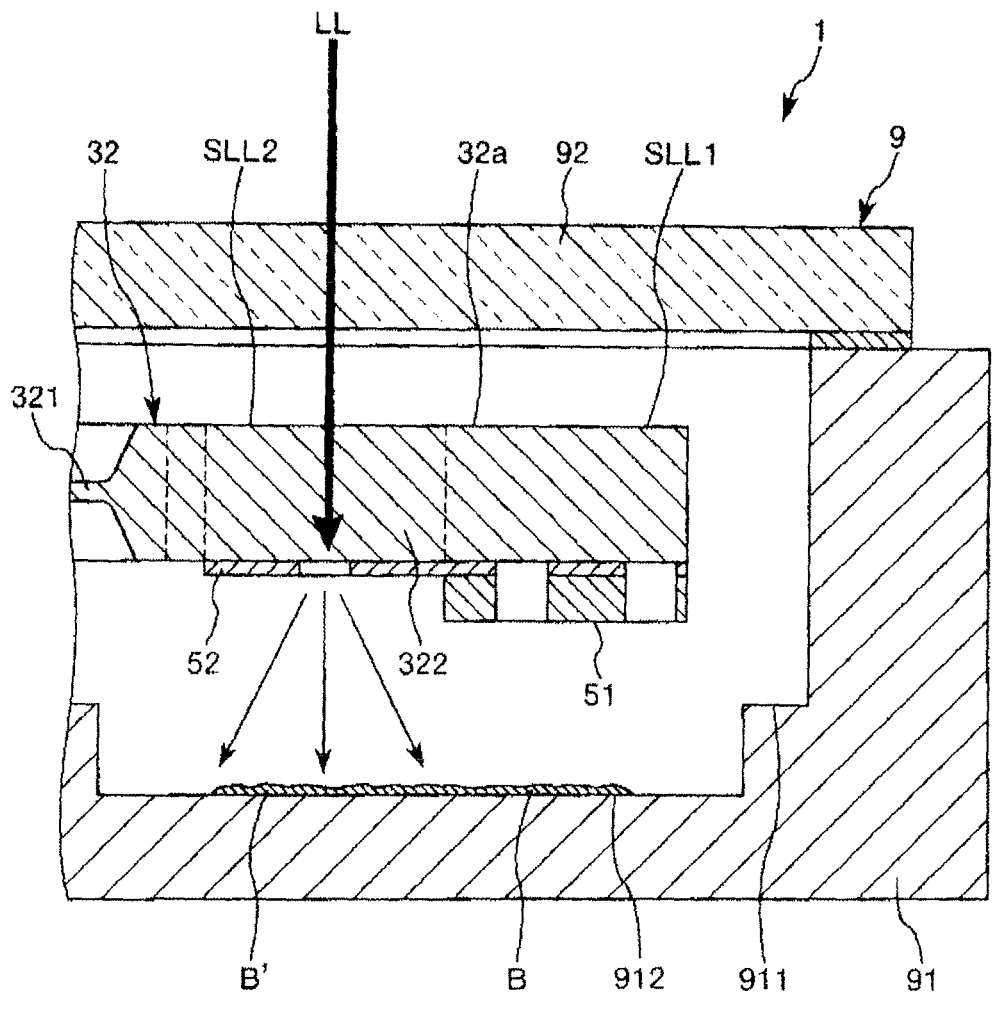
FIG. 12 is a cross-sectional view illustrating a frequency adjustment method.

Next, as shown in FIG. 12, the laser light LL is incident to the second weight portion 52 from the lid 92 side and at least a part of the second weight portion 52 is removed, in a state where the resonator element 2 is driven. Specifically, the laser light LL is introduced into the package 9 through the lid 92 and is transmitted through the hammer head 322 from the second laser incidence area SLL2 so as to be incident to the second weight portion 52 from the rear side, and accordingly, a part of the second weight portion 52 is removed. Since the second weight portion 52 is thinner than the first weight portion 51 and is positioned on the proximal end side with respect to the first weight portion 51, the ratio of the frequency change to the incidence time of the laser light LL (removed amount of the weight portion) is small. Accordingly, it can be said that this step is a fine adjustment step of finely adjusting the resonance frequency. The resonance frequency of the resonator element 2 further approaches the target value by performing the second adjustment step described above, and preferably coincides with the target value.

In this step, a weight material B' removed from the second weight portion 52 is scattered in the package 9 and most of the weight material is attached to the bottom surface of the recess 911 or the inner surface of the recess 912, in the same manner as the weight material B. Accordingly, the attachment of the scattered weight material B' to the inner surface of the lid 92 by moving around the resonator element 2 is suppressed. As a result, for the same reason as that for the weight material B, it is possible to efficiently suppress the reattachment of the weight material B' to the vibrating arm 32 due to evaporation by the laser light LL. Therefore, according to this step, it is possible to efficiently and accurately perform the frequency adjustment. Particularly, when the direction of the incidence of the laser light LL and the direction of acceleration of gravity are the same, a concern of the reattachment is further reduced.

According to the frequency adjustment method described above, since it is possible to prevent the reattachment of the removed weight materials B and B' to the vibrating arm 32, the adjustable frequency range is widened, and it is possible to efficiently and accurately adjust the resonance frequency of the resonator element 2. Since it is possible to perform the frequency adjustment in a state where the resonator element is mounted on the package 9, it is possible to more accurately adjust the resonance frequency. In addition, since the removed amount of the weight portion in the package 9 is comparatively small, it is possible to reduce occurrence of outgassing in the package 9. As described above, more significant effects are obtained by forming the second weight layer 5b by the vapor deposition method.

In the embodiment, the laser light LL is used as the energy beam, but the energy beam is not particularly limited as long as it can remove the weight portion 5, and an electron beam may be used, for example.

Second Embodiment

Figure 13:
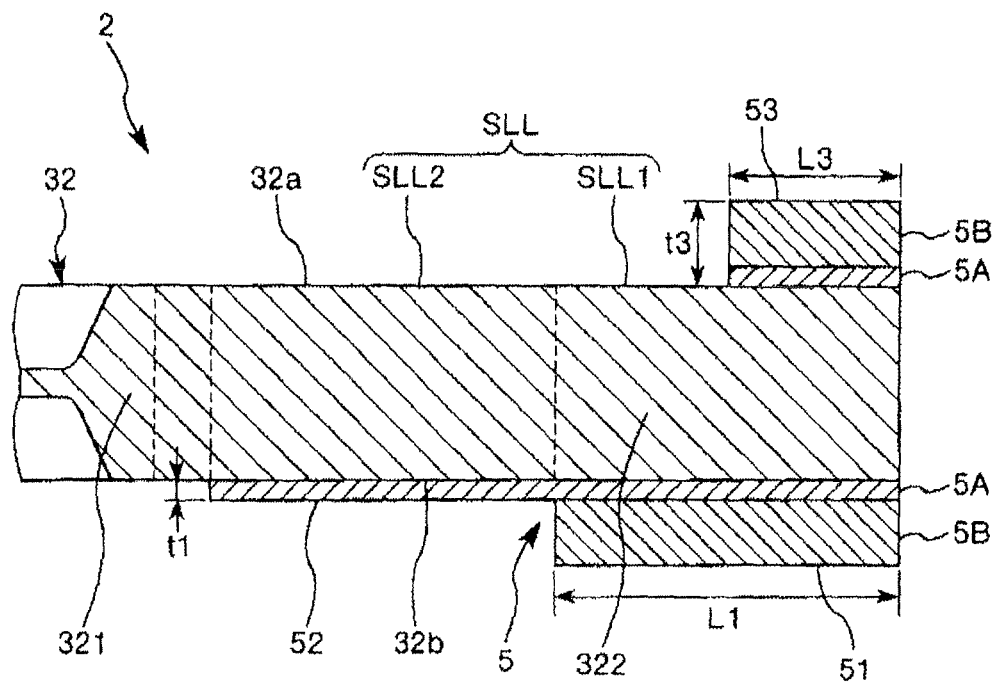
FIG. 13 is a cross-sectional view of a resonator element included in a resonator according to a second embodiment of the invention.
Figure 13:
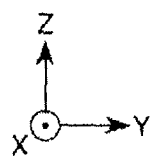
Figure 14:
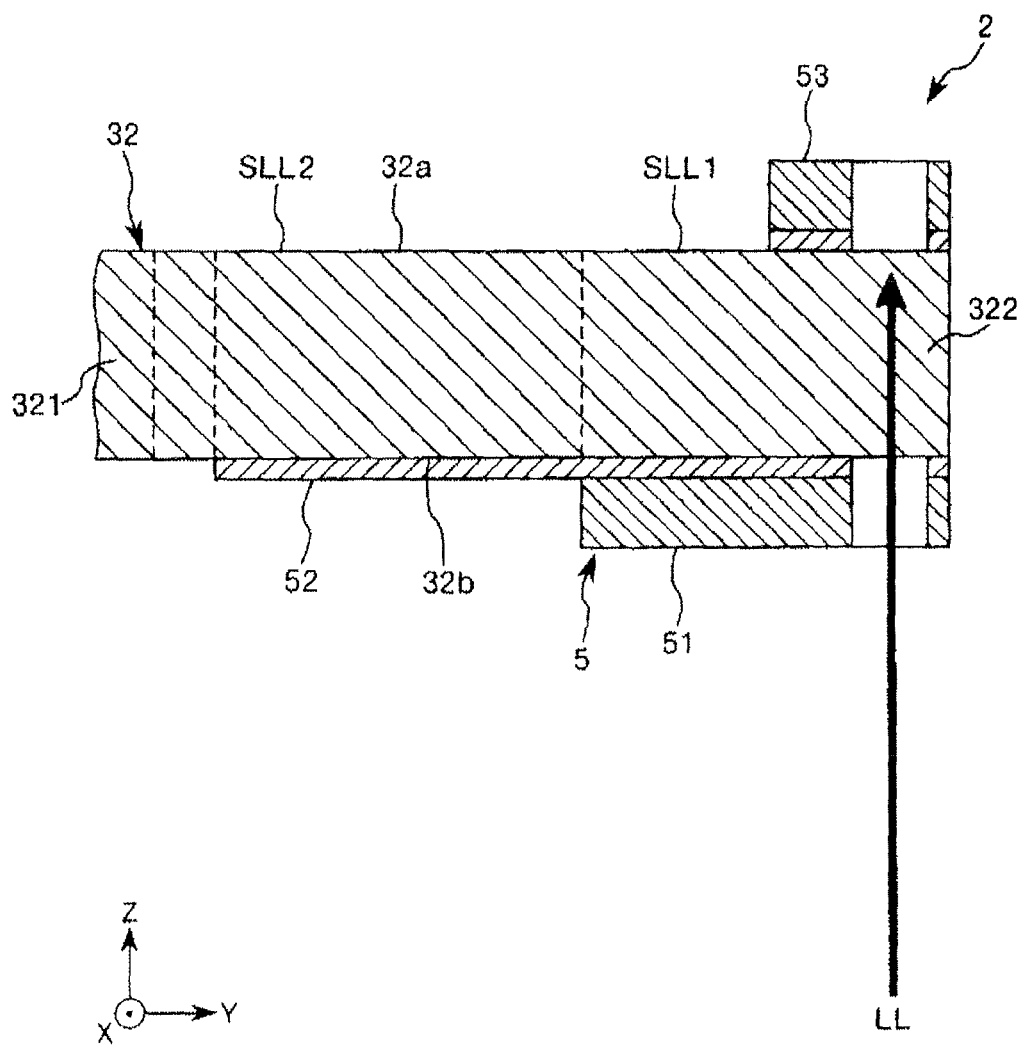
FIG. 14 is a cross-sectional view illustrating a frequency adjustment method.
Figure 15:
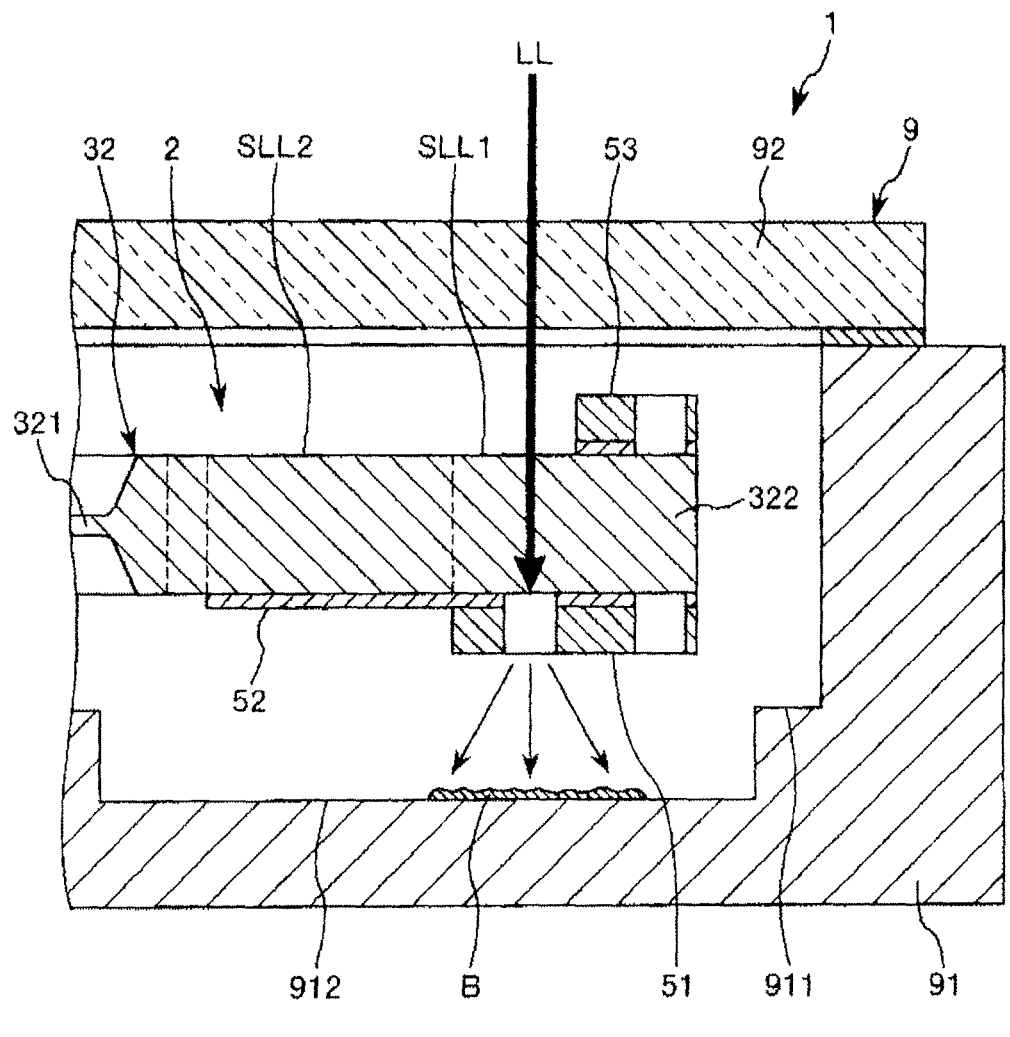
FIG. 15 is a cross-sectional view illustrating a frequency adjustment method.

FIG. 13 is a cross-sectional view of a resonator element included in a resonator according to a second embodiment of the invention. FIG. 14 and FIG. 15 are respectively cross-sectional views illustrating a frequency adjustment method.

Hereinafter, the description will be performed with a focus on the points of the resonator of the second embodiment different from the resonator of the embodiment described above, and the description of the same configurations will be omitted.

The resonator of the embodiment is the same as the resonator of the first embodiment, except for the different configuration of the weight portion included in the resonator element.

Resonator (Resonator Element)

As shown in FIG. 13, in the resonator element 2 of the embodiment, the weight portion 5 includes a third weight portion 53 disposed on the main surface 32a of the hammer head 322. The third weight portion 53 is used for the frequency adjustment in the coarse adjustment step described above.

The third weight portion 53 is disposed so as to be overlapped with a part of the first weight portion 51 in a plan view (plan view when seen in the Z axis direction). More specifically, when a length of the third weight portion 53 in the extension direction of the vibrating arm 32 (Y axis direction) is set as L3, a relationship of L3<L1 is satisfied, and the third weight portion is disposed so as to be overlapped with the distal end portion of the first weight portion 51 in a plan view. Accordingly, the first laser incidence area SLL1 is disposed in a position of the main surface 32a of the hammer head 322 overlapped with the proximal end portion of the first weight portion 51. A thickness t3 of the third weight portion 53 is greater than the thickness of the second weight portion 52 (thickness t1 of the first weight layer 5A), and is a thickness substantially equivalent to that of the first weight portion 51, in the embodiment. Accordingly, as will be described later, it is possible to more efficiently perform the frequency adjustment in the coarse adjustment step.

The configuration of the third weight portion 53 is not particularly limited, and can be the same configuration as that of the first weight portion 51. That is, the third weight portion 53 can be configured with a laminated body of the first weight layer 5A and the second weight layer 5B.

Frequency Adjustment Step

Next, a method of adjusting the resonance frequency of the resonator element 2 described above will be described with reference to FIG. 14 and FIG. 15. Hereinafter, for convenience of description, a case of removing the weight portion 5 provided on the vibrating arm 32 will be described as a representative, but the weight portion 5 provided on the vibrating arm 33 is also removed in the same manner.

The resonance frequency adjustment method includes a coarse adjustment step of performing coarse adjustment of the resonance frequency of the resonator element 2 before accommodating the resonator element in the package 9, an accommodation step of accommodating the resonator element 2 subjected to the coarse adjustment in the package 9, a first adjustment step of adjusting (coarse adjustment) of the resonance frequency of the resonator element 2 in the package 9 using the first weight portion 51, and a second adjustment step of adjusting (fine adjustment) of the resonance frequency of the resonator element 2 in the package 9 using the second weight portion 52.

Coarse Adjustment Step

First, as shown in FIG. 14, the laser light LL is incident to the area where the first weight portion 51 and the third weight portion 53 are overlapped with each other and a part of the first and third weight portions 51 and 53 is removed, in a state where the resonator element 2 is driven. Accordingly, the resonance frequency of the resonator element 2 roughly approaches a target value. Since this area is positioned in the distal end portion of the vibrating arm 32 and is an area where the first and third weight portions 51 and 53 are overlapped with each other, the ratio of the frequency change to the incidence time of the laser light LL (removed amount of the weight portion) is great. Accordingly, it is possible to more efficiently perform the coarse adjustment of the resonance frequency. Particularly, as described above, since the thickness of the third weight portion 53 is greater than the thickness of the second weight portion 52, the significant effects described above are obtained.

Accommodation Step

This step is the same as that in the first embodiment, and therefore the description thereof will be omitted.

First Adjustment Step

Next, as shown in FIG. 15, the laser light LL is incident to the first weight portion 51 from the lid 92 side, and at least a part of the first weight portion 51 is removed, in a state where the resonator element 2 is driven. Specifically, the laser light LL is introduced into the package 9 through the lid 92 and is transmitted through the hammer head 322 from the first laser incidence area SLL1 so as to be incident to the first weight portion 51 from the rear side, and accordingly, a part of the first weight portion 51 is removed. Accordingly, the resonance frequency of the resonator element 2 further approaches the target value.

Second Adjustment Step

This step is the same as that in the first embodiment, and therefore the description thereof will be omitted.

Even in the second embodiment, it is possible to exhibit the same effect as that of the first embodiment.

Third Embodiment

Figure 16:
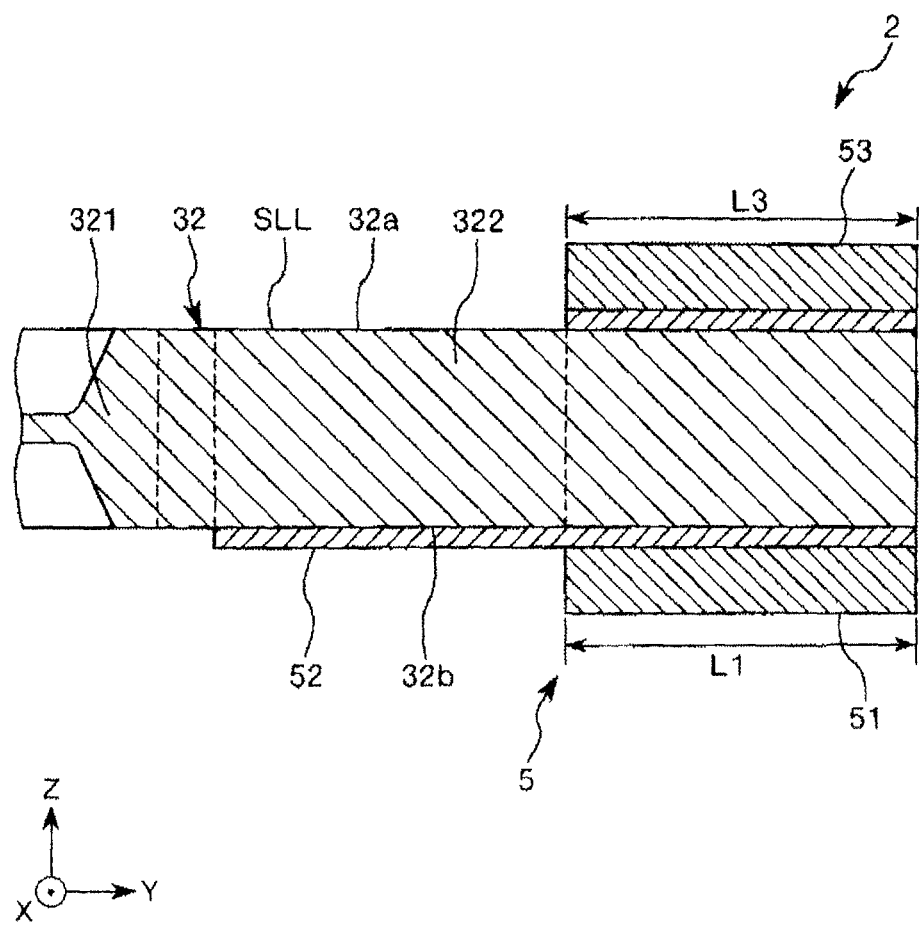
FIG. 16 is a cross-sectional view of a resonator element included in a resonator according to a third embodiment of the invention.

FIG. 16 is a cross-sectional view of a resonator element included in a resonator according to a third embodiment of the invention.

Hereinafter, the description will be performed with a focus on the points of the resonator of the third embodiment different from the resonator of the embodiment described above, and the description of the same configurations will be omitted.

The resonator of the embodiment is the same as the resonator of the second embodiment, except for the different configuration of the weight portion (third weight portion) included in the resonator element.

Resonator (Resonator Element)

As shown in FIG. 16, in the resonator element 2 of the embodiment, the third weight portion 53 is disposed so as to be overlapped with the entire area of the first weight portion 51 in a plan view (plan view when seen in the Z axis direction). More specifically, the length L3 of the third weight portion 53 satisfies a relationship of L3=L1, and the third weight portion is disposed so as to be overlapped with the first weight portion 51 in a plan view. Accordingly, the laser incidence area SLL is not disposed in a position of the main surface 32a of the hammer head 322 overlapped with the first weight portion 51.

Even in the third embodiment, it is possible to exhibit the same effect as that of the first embodiment.

Fourth Embodiment

Figure 17:
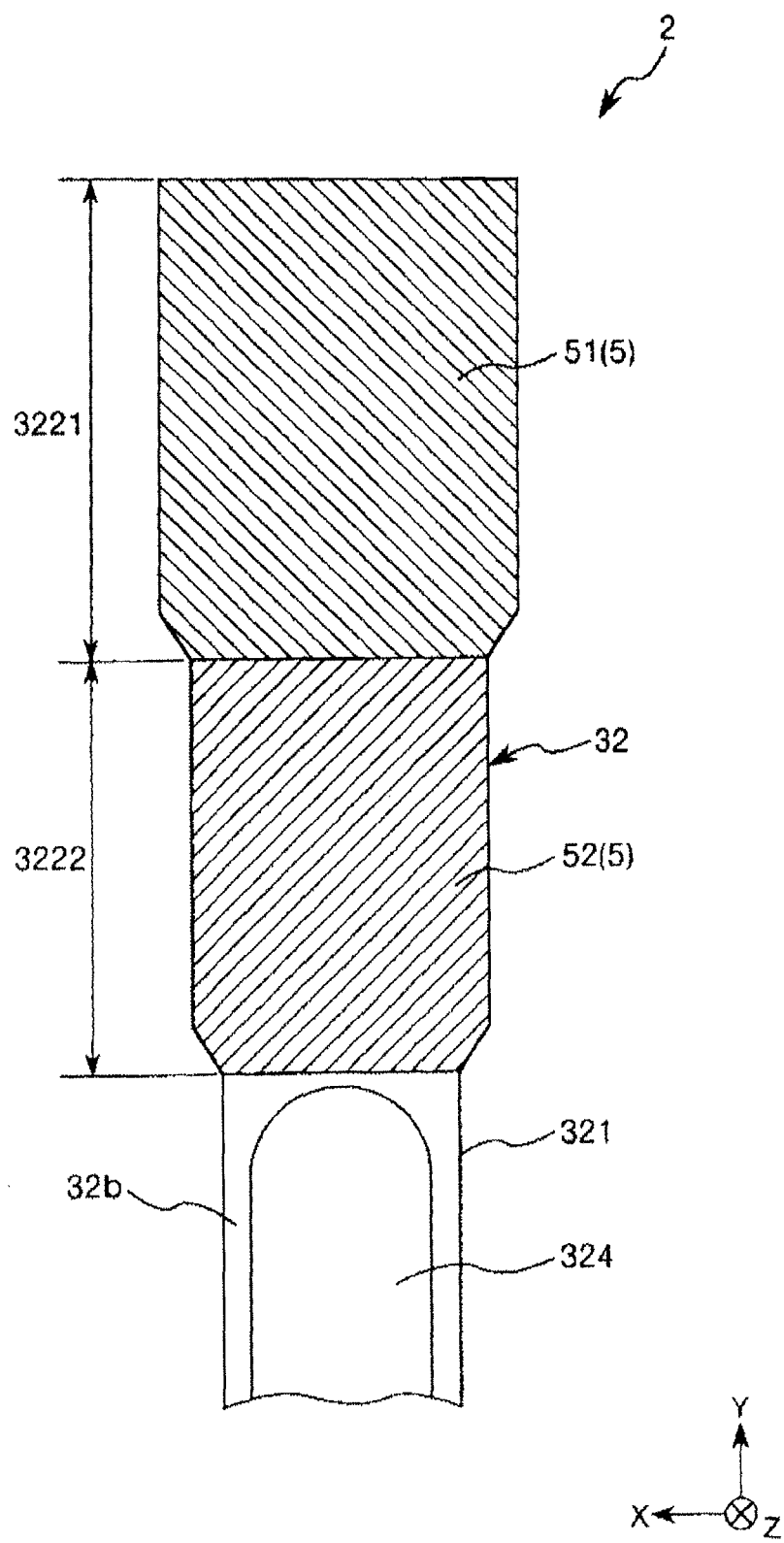
FIG. 17 is a plan view of a resonator element included in a resonator according to a fourth embodiment of the invention.

FIG. 17 is a plan view of a resonator element included in a resonator according to a fourth embodiment of the invention.

Hereinafter, the description will be performed with a focus on the points of the resonator of the fourth embodiment different from the resonator of the embodiment described above, and the description of the same configurations will be omitted.

The resonator of the embodiment is the same as the resonator of the first embodiment, except for the different shape of the hammer head included in the resonator element.

Resonator (Resonator Element)

As shown in FIG. 17, in the resonator element 2 of the embodiment, the hammer head 322 includes a distal end portion 3221 which is positioned on the distal end side, and a proximal end portion 3222 which is positioned on the proximal end side of the distal end portion 3221 and has a smaller width than that of the distal end portion 3221. The first weight portion 51 is disposed on the main surface 32b of the distal end portion 3221, and the second weight portion 52 is disposed on the main surface 32b of the proximal end portion 3222. When the weight portion 5 is seen from the lid 92 side, only the rear surface of the first weight layer 5A is recognized, and the boundary between the first weight portion 51 and the second weight portion 52 is not recognized. However, as in the embodiment, by setting the hammer head 322 to have a two-step shape, it is easy to visually recognize the position (boundary) of the first weight portion 51 and the second weight portion 52, and it is possible to more accurately perform the incidence of the laser light LL.

Even in the fourth embodiment, it is possible to exhibit the same effect as that of the first embodiment.

2. Oscillator

Next, an oscillator including the resonator element according to the invention will be described.

Figure 18:
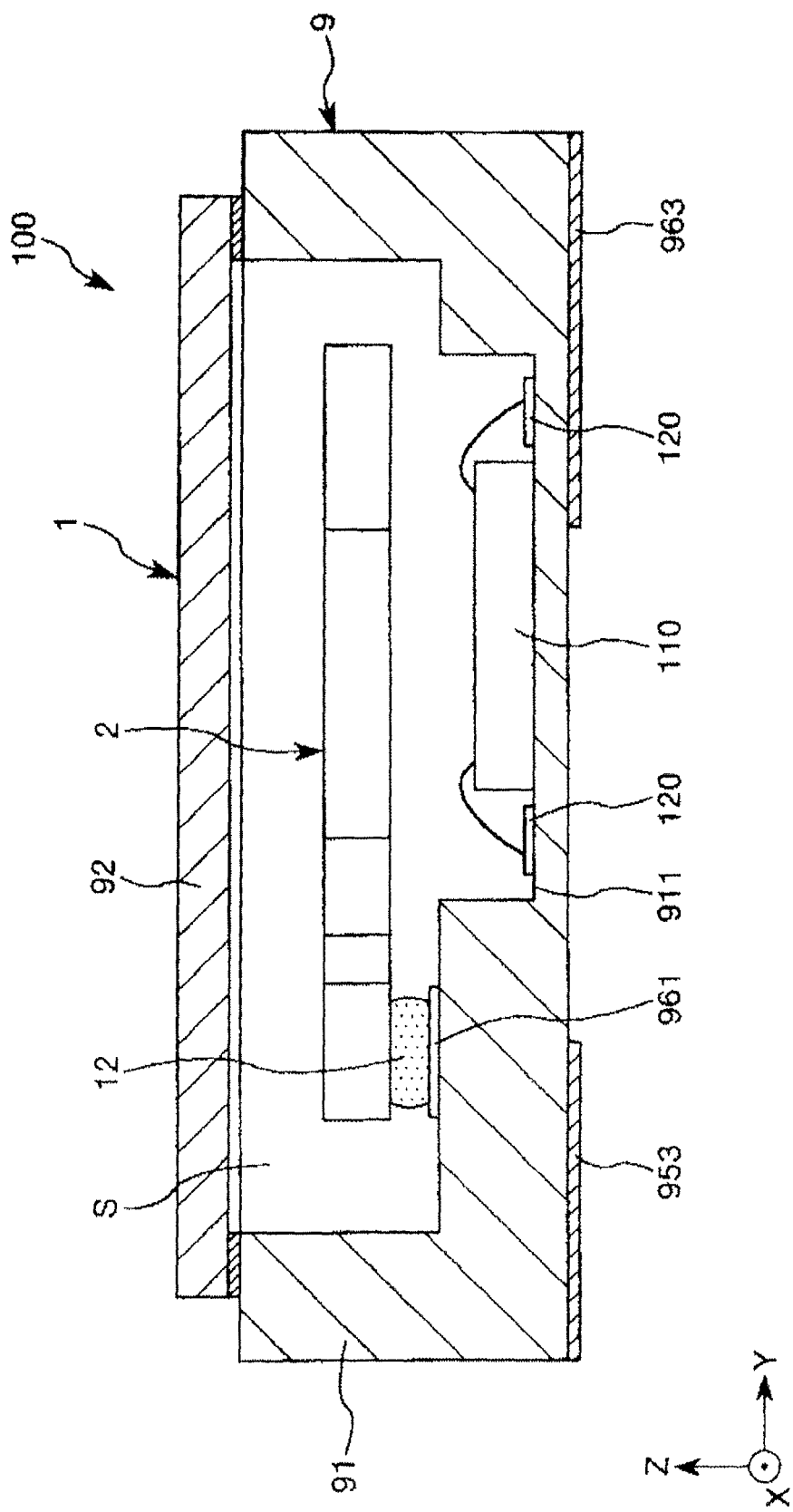
FIG. 18 is a cross-sectional view showing a preferred embodiment of an oscillator according to the invention.

FIG. 18 is a cross-sectional view showing a preferred embodiment of the oscillator according to the invention. In FIG. 18, for convenience of description, the first and second excitation electrodes and the weight portion of the resonator element 2 are omitted.

An oscillator 100 shown in FIG. 18 includes the resonator 1 and an IC chip 110 for driving the resonator element 2. Hereinafter, the description will be performed with a focus on the points of the oscillator 100 different from the resonator described above, and the description of the same configurations will be omitted.

As shown in FIG. 18, in the oscillator 100, the IC chip 110 is fixed to the recess 911 of the base 91. The IC chip 110 is electrically connected to a plurality of inner terminals 120 formed on the bottom surface of the recess 911. One of the plurality of inner terminals 120 is connected to the connection terminals 951 and 961 and another one thereof is connected to the external terminals 953 and 963. The IC chip 110 includes an oscillation circuit (circuit) for controlling the vibration of the resonator element 2. When the resonator element 2 is driven by the IC chip 110, it is possible to extract a signal at a predetermined frequency.

3. Physical Quantity Sensor

Next, a physical quantity sensor including the resonator element according to the invention will be described.

Figure 19:
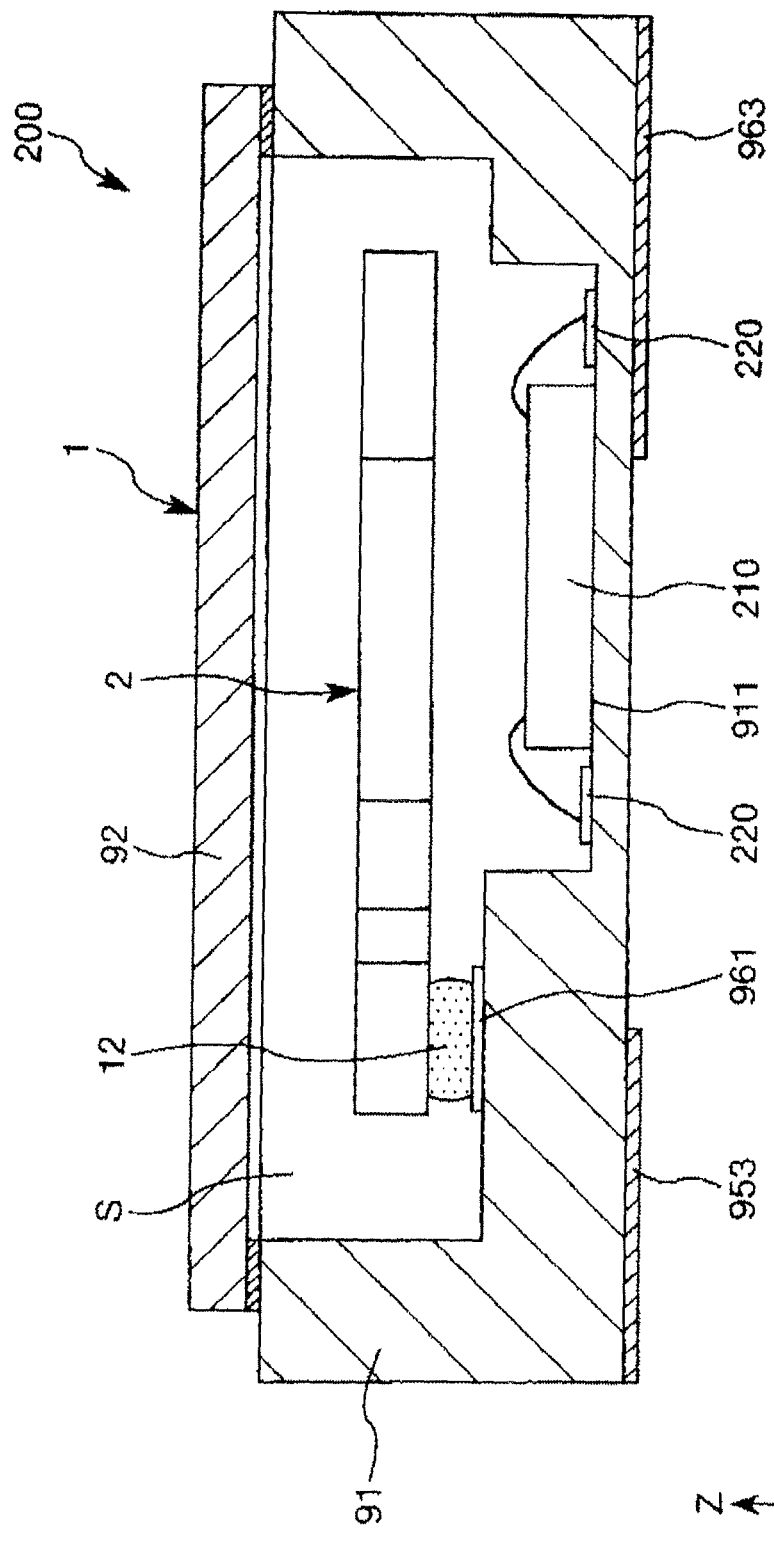
FIG. 19 is a cross-sectional view showing a preferred embodiment of a physical quantity sensor according to the invention.

FIG. 19 is a cross-sectional view showing a preferred embodiment of the physical quantity sensor according to the invention. In FIG. 19, for convenience of description, the first and second excitation electrodes and the weight portion of the resonator element 2 are omitted.

A physical quantity sensor 200 shown in FIG. 19 is an angular velocity sensor (gyro sensor) which can detect angular velocity around the Y axis, and includes the resonator 1, and the IC chip 110 for driving the resonator element 2. Hereinafter, the description will be performed with a focus on the points of the physical quantity sensor 200 different from the resonator described above, and the description of the same configurations will be omitted.

As shown in FIG. 19, in the physical quantity sensor 200, an IC chip 210 is fixed to the recess 911 of the base 91. The IC chip 210 is electrically connected to a plurality of inner terminals 220 formed on the bottom surface of the recess 911. One of the plurality of inner terminals 220 is connected to the connection terminals 951 and 961 and another one thereof is connected to the external terminals 953 and 963. The IC chip 210 includes an oscillation circuit (circuit) for controlling the excitation of the resonator element 2, and a detection circuit for detecting the angular velocity.

In such a physical quantity sensor, when the angular velocity around the Y axis is applied when the excitation vibration of the vibrating arms 32 and 33 is performed in the excitation vibration mode which is the X reversed-phase mode, a detection vibration mode which is a Z axis reversed-phase mode is generated in the vibrating arms 32 and 33. An electrode voltage (voltage between the first and second excitation electrodes 84 and 85) changes by this detection vibration mode, and it is possible to detect the angular velocity based on this change.

The physical quantity sensor is not particularly limited to the angular velocity sensor, and an acceleration sensor or a pressure sensor can also be used.

4. Electronic Apparatus

An electronic apparatus including the resonator element according to the invention will be described.

Figure 20:
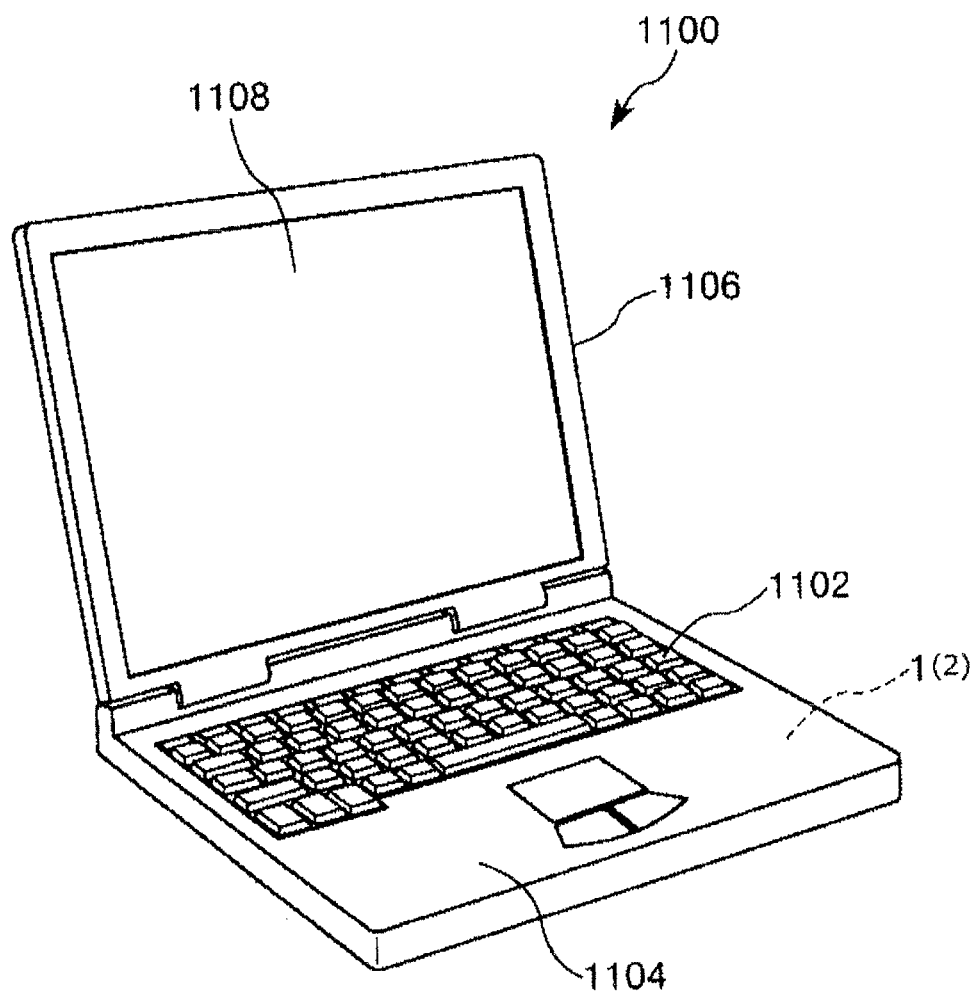
FIG. 20 is a perspective view showing a configuration of a mobile type (or notebook type) personal computer to which an electronic apparatus according to the invention is applied.

FIG. 20 is a perspective view showing a configuration of a mobile type (or notebook type) personal computer to which the electronic apparatus according to the invention is applied. In this drawing, a personal computer 1100 is configured with a main body unit 1104 including a keyboard 1102 and a display unit 1106 including a display section 1108, and the display unit 1106 is rotatably supported with respect to the main body unit 1104 through a hinge structure portion. The resonator 1 (resonator element 2) which functions as a filter, a resonator, and a reference clock is embedded in such a personal computer 1100.

Figure 21:
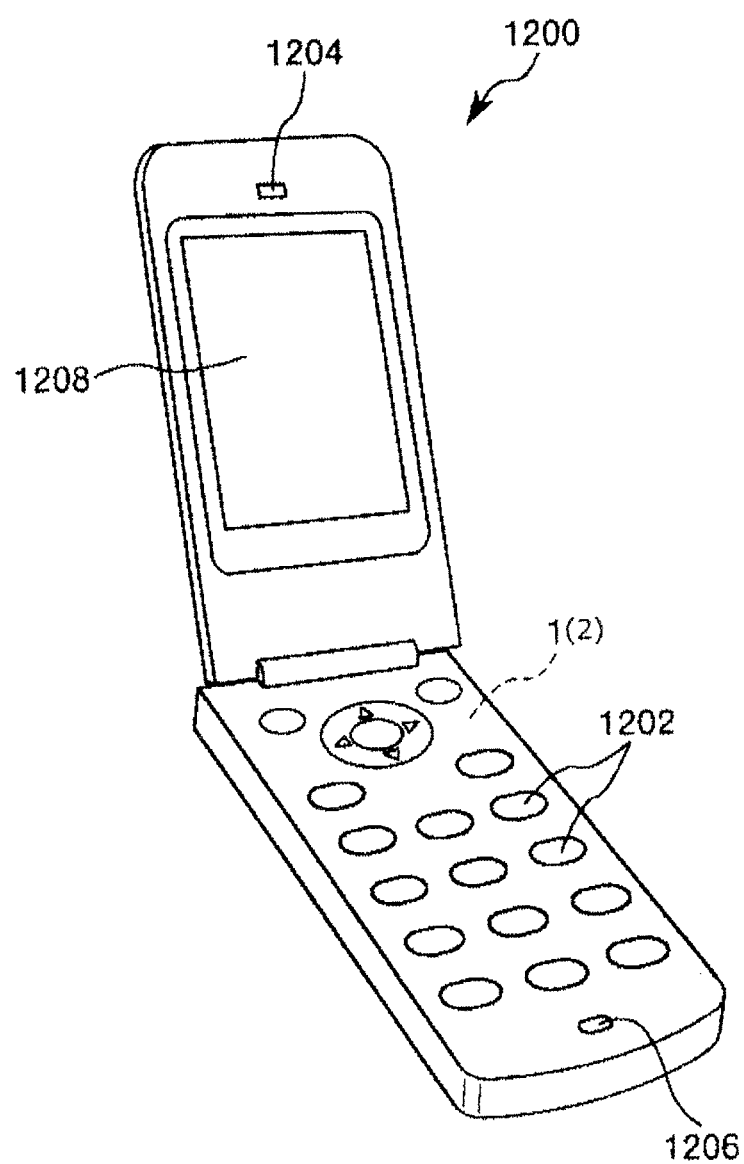
FIG. 21 is a perspective view showing a configuration of a mobile phone (also including a PHS) to which an electronic apparatus according to the invention is applied.

FIG. 21 is a perspective view showing a configuration of a mobile phone (also including a PHS) to which the electronic apparatus according to the invention is applied. In the drawing, the mobile phone 1200 includes a plurality of operation buttons 1202, an earpiece 1204, and a mouthpiece 1206, and a display unit 1208 is disposed between the operation buttons 1202 and the earpiece 1204. The resonator 1 (resonator element 2) which functions as a filter, a resonator, and a reference clock is embedded in such a mobile phone 1200.

Figure 22:
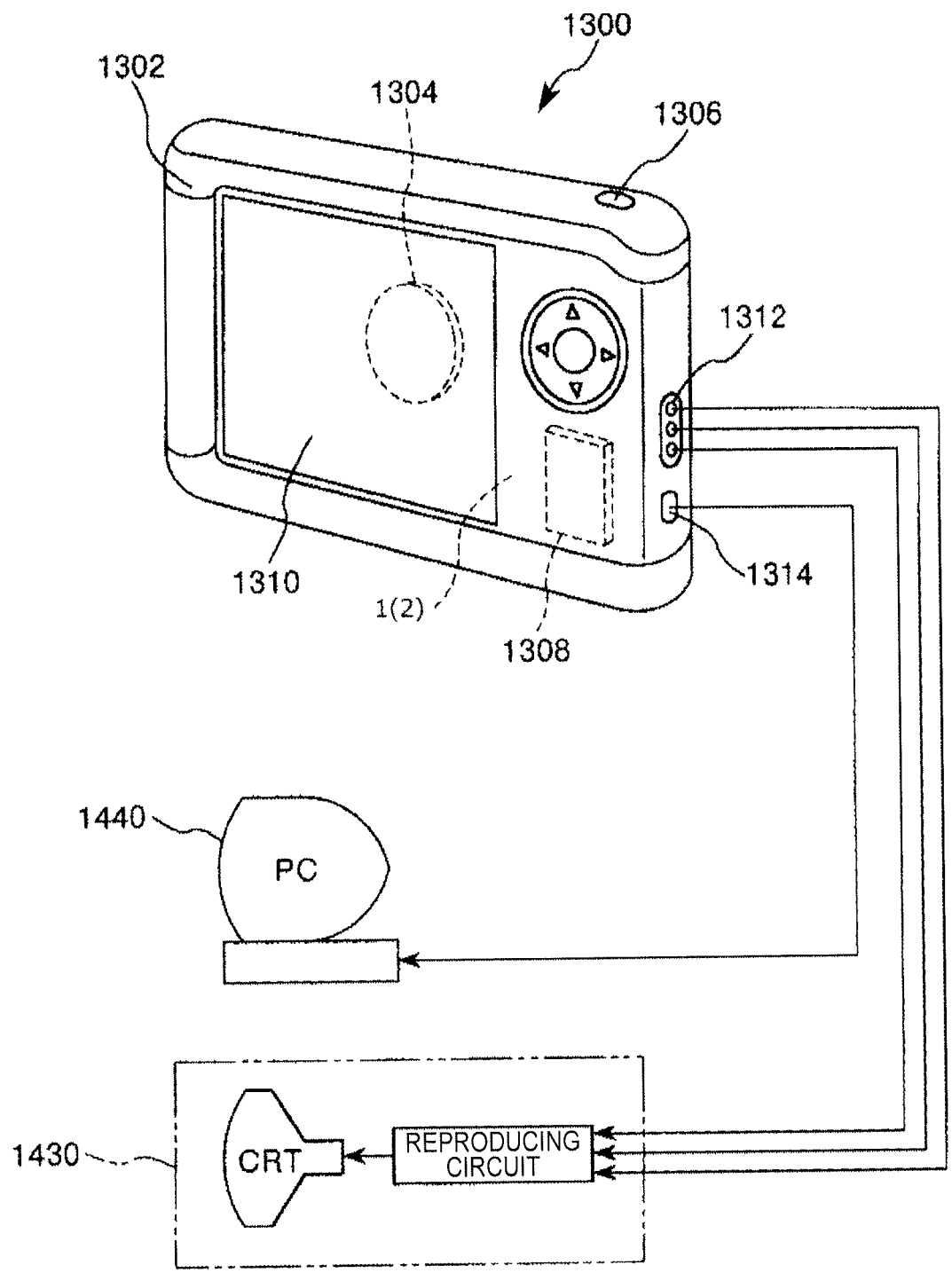
FIG. 22 is a perspective view showing a configuration of a digital still camera to which an electronic apparatus according to the invention is applied.

FIG. 22 is a perspective view showing a configuration of a digital still camera to which the electronic apparatus according to the invention is applied. The drawing also simply shows connection to an external device. Herein, the digital still camera 1300 generates an imaging signal (image signal) by performing photoelectric conversion of a light image of a subject by an imaging device such as a charge coupled device (CCD), whereas the general film camera exposes a silver-halide photo film by a light image of a subject.

A display unit 1310 is provided on a rear surface of a case (body) 1302 of the digital still camera 1300 and has a configuration of performing a display based on the imaging signal by the CCD, and the display unit functions as a finder for displaying a subject as an electronic image. A light receiving unit 1304 including an optical lens (optical imaging system) or the CCD is provided on a front surface side of the case 1302 (back surface side in the drawing).

When a photographer confirms a subject image displayed on the display unit and presses a shutter button 1306, an imaging signal of CCD at that point in time is transmitted and stored in a memory 1308. In the digital still camera 1300, a video signal output terminal 1312 and a data communication input and output terminal 1314 are provided on a side surface of the case 1302. As shown in the drawing, a television monitor 1430 is connected to the video signal output terminal 1312 and a personal computer 1440 is connected to the data communication input and output terminal 1314, respectively, if necessary. In addition, the imaging signal stored in the memory 1308 is output to the television monitor 1430 or the personal computer 1440 by a predetermined operation. The resonator 1 (resonator element 2) which functions as a filter, a resonator, and a reference clock is embedded in such a digital still camera 1300.

In addition to the personal computer (mobile type personal computer) shown in FIG. 20, the mobile phone shown in FIG. 21, and the digital still camera shown in FIG. 22, the electronic apparatus including the resonator according to the invention can be applied to an ink jet type discharging apparatus (for example, ink jet printer), a laptop type personal computer, a television, a video camera, a video tape recorder, a car navigation device, a pager, an electronic organizer (including communication function), an electronic dictionary, a calculator, an electronic game device, a word processer, a work station, a video phone, a security monitor, electronic binoculars, a POS terminal, medical equipment (for example, an electronic thermometer, a blood pressure meter, a blood glucose meter, an ECG measuring device, a ultrasound diagnostic device, or an electronic endoscope), a fishfinder, a variety of measurement equipment, a meter (for example, a meter for vehicles, aircraft, or a ship), a flight simulator, or the like.

5. Mobile Object

Next a mobile object including the resonator element according to the invention will be described.

Figure 23:
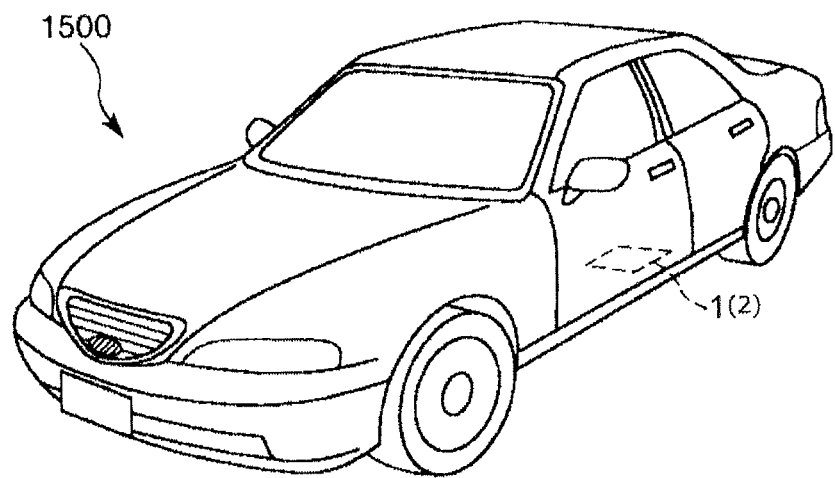
FIG. 23 is a perspective view showing a vehicle to which a mobile object according to the invention is applied.

FIG. 23 is a perspective view showing a vehicle to which the mobile object according to the invention is applied. The resonator 1 (resonator element 2) is mounted in a vehicle 1500. The resonator 1, for example, can also be widely applied to an electronic control unit (ECU) such as a keyless entry, an immobilizer, a car navigation system, a car air conditioner, an anti-lock brake system (ABS), an air bag, a tire pressure monitoring system (TPMS), an engine control, a battery charge monitor of a hybrid car or an electric car, or a vehicle body attitude control system.

Hereinabove, the resonator, oscillator, the electronic apparatus, the physical quantity sensor, and the mobile object according to the invention have been described based on the embodiments shown in the drawings, but the invention is not limited thereto, and the configuration of each unit can be replaced with an arbitrary configuration having the same function. The other arbitrary configuration may be added to the invention. Each embodiment may be suitably combined.

In the embodiments described above, one groove is provided on each main surface of each vibrating arm, but the number of grooves is not particularly limited, and the grooves may be two or more. For example, two grooves arranged in the X axis direction may be provided on each main surface.

In the embodiments described above, the quartz crystal is used as the constituent material of the resonator blank, but the constituent material of the resonator blank is not limited thereto, and aluminum nitride (AlN), an oxide substrate of lithium niobate ($LiNbO_3$), lithium tantalate ($LiTaO_3$), lead zirconate titanate (PZT), lithium tetraborate ($Li_2B_4O_7$), or langasite crystal ($La_3Ga_5SiO_{14}$), a stacked piezoelectric substrate configured by stacking a piezoelectric material such as aluminum nitride or tantalum pentoxide ($Ta_2O_5$) on a glass substrate, or piezoelectric ceramics can be used, for example.

In addition, the resonator blank can be formed using a material other than the piezoelectric material. For example, the resonator blank can also be formed using a silicon semiconductor material. A vibration (excitation) method of the resonator blank is not limited to piezoelectric excitation. In addition to the piezoelectric excitation type using a piezoelectric substrate, it is possible to exhibit the configuration and the effect of the invention, even with the resonator blank with an electrostatic excitation type using an electrostatic force or a Lorentz excitation type using a magnetic force. In addition, in the specification or the drawings, a term which is disclosed with a different term having a wider or the same meaning at least once can be replaced with the different term in any part of the specification or the drawings.

The entire disclosure of Japanese Patent Application No. 2013-273626, filed Dec. 27, 2013 is expressly incorporated by reference herein.

What is claimed is:
1. A resonator element comprising:
   a base portion; and
   a vibrating arm which extends from the base portion in a plan view and on which a weight portion is provided, the vibrating arm having a distal end portion on the opposite side of the base portion, the distal end porting having first and second surfaces facing in opposite directions,
wherein the weight portion includes
a first weight portion which is disposed on the first surface of the distal end portion of the vibrating arm, in a plan view, and
a second weight portion which is disposed closer to the base portion than the first weight portion and has a thickness smaller than that of the first weight portion, the second weight portion being disposed on the first surface of the distal end portion,
the vibrating arm is arranged to receive a laser beam from outside the vibrating arm at the second surface of the distal end portion, and
an area on the second surface where incidence of the laser beam to the inside of the vibrating arm is allowed, is disposed in a position overlapped with the second weight portion in a plan view, the second surface including a material allowing transmission of the laser beam, and the material being exposed at the area on the second surface where incidence of the laser beam to the inside of the vibrating arm is allowed.

2. The resonator element according to claim 1, wherein the area is also disposed in a position of the second surface overlapped with the first weight portion in a plan view.

3. The resonator element according to claim 1, wherein, when a length of the first weight portion in the extension direction is set as L1 and a length of the second weight portion in the extension direction is set as L2, a relationship of the following formula:

$$0.1 \leq \frac{L1}{L1+L2} \leq 0.8$$

is satisfied.

4. The resonator element according to claim 3, wherein a relationship of the following formula:

$$0.3 \leq \frac{L1}{L1+L2} \leq 0.6$$

is satisfied.

5. The resonator element according to claim 1, wherein the first weight portion is formed by stacking at least a first weight layer and a second weight layer provided on the first weight layer, from the first surface side, and
the second weight portion is configured with the first weight layer.

6. The resonator element according to claim 5, wherein the first weight layer is formed by a sputtering method, and the second weight layer is formed by a vapor deposition method.

7. The resonator element according to claim 1, wherein the weight portion includes a third weight portion which is disposed on the second surface so as to be overlapped with the first weight portion in a plan view.

8. The resonator element according to claim 7, wherein a thickness of the third weight portion is greater than a thickness of the second weight portion.

9. The resonator element according to claim 7, wherein, when a length of the first weight portion in the extension direction is set as L1 and a length of the third weight portion in the extension direction is set as L3, a relationship of L3<L1 is satisfied.

10. The resonator element according to claim 1, wherein the vibrating arm includes
a wide width portion, and
an arm which is disposed between the base portion and the wide width portion and has a width smaller than that of the wide width portion, and
the weight portion is disposed in the wide width portion.

11. A resonator comprising:
the resonator element according to claim 1; and
a package in which the resonator element is accommodated.

12. A resonator comprising:
the resonator element according to claim 2; and
a package in which the resonator element is accommodated.

13. An oscillator comprising:
the resonator element according to claim 1; and
a circuit.

14. An oscillator comprising:
the resonator element according to claim 2; and
a circuit.

15. An electronic apparatus comprising:
the resonator element according to claim 1.

16. A physical quantity sensor comprising:
the resonator element according to claim 1.

17. A mobile object comprising:
the resonator element according to claim 1.

18. A frequency adjustment method of a resonator element comprising:
accommodating a resonator element in a package;
performing first adjustment of a resonance frequency of the resonator element; and
performing second adjustment of the resonance frequency of the resonator element,
wherein the resonator element includes
a base portion, and
a vibrating arm which extends from the base portion in a plan view and on which a weight portion is provided, the vibrating arm having a distal end portion on the opposite side of the base portion, the distal end portion having first and second surfaces facing in opposite directions,
the weight portion includes
a first weight portion which is disposed on the first surface of the distal end portion of the vibrating arm, in a plan view, and
a second weight portion which is disposed closer to the base portion than the first weight portion and has a thickness smaller than that of the first weight portion, the second weight portion being disposed on the first surface of the distal end portion,
the vibrating arm is arranged to receive a laser beam from outside the vibrating arm at the second surface of the distal end portion,
an area on the second surface where incidence of the laser beam to the inside of the vibrating arm is allowed, is disposed in a position overlapped with the second weight portion in a plan view, the second surface including a material allowing transmission of the laser beam, and the material being exposed at the area on the second surface where incidence of the laser beam to the inside of the vibrating arm is allowed,
the package includes a transmission portion which transmits the laser beam, the transmission portion facing the second surface of the distal end portion and not facing the first surface of the distal end portion, when accommodating the resonator element, the resonator element is accommodated in the package in a state where the second surface is positioned on the transmission portion side and the transmission portion and the area face each other, when performing the first adjustment of the resonance frequency of the resonator element, the laser beam is introduced into the package through the transmission portion and is transmitted through the vibrating arm from the second surface to be emitted to the first weight portion, to remove at least a part of the first weight portion, and when performing the second adjustment of the resonance frequency of the resonator element, the laser beam is introduced into the package through the transmission portion and is transmitted through the vibrating arm from the area to be emitted to the second weight portion, to remove at least apart of the second weight portion.

19. The frequency adjustment method of a resonator element according to claim 18, wherein the area is also disposed in a position of the second surface of the distal end portion of the vibrating arm overlapped with the first weight portion in a plan view, and when performing the first adjustment of the resonance frequency of the resonator element, the laser beam is introduced into the package through the transmission portion and is transmitted through the vibrating arm from the area to be emitted to the first weight portion, to remove at least a part of the first weight portion.

* * * * *